US012367838B2

(12) United States Patent
In et al.

(10) Patent No.: US 12,367,838 B2
(45) Date of Patent: Jul. 22, 2025

(54) GATE DRIVER

(71) Applicant: Samsung Display Co., Ltd., Yongin-si (KR)

(72) Inventors: Haijung In, Yongin-si (KR); Minku Lee, Yongin-si (KR); Seunghee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 9 days.

(21) Appl. No.: 18/116,104

(22) Filed: Mar. 1, 2023

(65) Prior Publication Data

US 2023/0326411 A1 Oct. 12, 2023

(30) Foreign Application Priority Data

Apr. 11, 2022 (KR) .......................... 10-2022-0044640

(51) Int. Cl.
*G09G 3/3266* (2016.01)

(52) U.S. Cl.
CPC ... *G09G 3/3266* (2013.01); *G09G 2310/0267* (2013.01); *G09G 2310/0286* (2013.01); *G09G 2310/08* (2013.01)

(58) Field of Classification Search
CPC ........ G09G 3/3266; G09G 2310/0267; G09G 2310/0286; G09G 2310/08; G09G 3/20; G09G 3/3233; G09G 3/32; G09G 2300/0809; G11C 19/28
See application file for complete search history.

(56) References Cited

U.S. PATENT DOCUMENTS

| | | | |
|---|---|---|---|
| 8,937,489 B2 | 1/2015 | Park et al. | |
| 10,176,778 B2 | 1/2019 | Kim | |
| 10,403,208 B2 | 9/2019 | Kwon et al. | |
| 10,825,414 B2 | 11/2020 | Tanaka et al. | |
| 11,205,374 B2 | 12/2021 | Na et al. | |
| 11,270,629 B2 | 3/2022 | Yu | |
| 2017/0345366 A1 | 11/2017 | Jang | |
| 2018/0122322 A1* | 5/2018 | Ji | G11C 19/28 |
| 2019/0213939 A1 | 7/2019 | Wu et al. | |

(Continued)

FOREIGN PATENT DOCUMENTS

| | | |
|---|---|---|
| KR | 10-2012-0091881 A | 8/2012 |
| KR | 10-2017-0048630 A | 5/2017 |
| KR | 10-2017-0081801 A | 7/2017 |

(Continued)

*Primary Examiner* — Patrick N Edouard
*Assistant Examiner* — Joseph P Fox
(74) *Attorney, Agent, or Firm* — Womble Bond Dickinson (US) LLP

(57) ABSTRACT

A stage of a gate driver includes: a first node controller and a second node controller. The first node controller includes a first control transistor connected between a first node and a second node, and the first control transistor includes a first gate and a second gate that are connected to a first voltage input terminal for receiving a first voltage of an on-voltage level. The second node controller includes a second control transistor connected between a third node and a second voltage input terminal for receiving a second voltage of an off-voltage level, and the second control transistor includes a first gate connected to the first node and a second gate connected to the second voltage input terminal.

20 Claims, 12 Drawing Sheets

(56) References Cited

U.S. PATENT DOCUMENTS

2021/0035489 A1    2/2021  Seo et al.
2021/0074215 A1*   3/2021  Park .................... G09G 3/3225

FOREIGN PATENT DOCUMENTS

| KR | 10-2019-0141781 A | 12/2019 |
| KR | 10-2020-0013923 A |  2/2020 |
| KR | 10-2020-0142161 A | 12/2020 |
| KR | 10-2021-0014258 A |  2/2021 |
| KR | 10-2021-0029336 A |  3/2021 |

* cited by examiner

GATE DRIVER

CROSS-REFERENCE TO RELATED APPLICATION

The present application claims priority to and the benefit of Korean Patent Application No. 10-2022-0044640, filed on Apr. 11, 2022, in the Korean Intellectual Property Office, the entire disclosure of which is incorporated herein by reference.

BACKGROUND

1. Field

Aspects of one or more embodiments relate to a display apparatus comprising a gate driver.

2. Description of the Related Art

Display apparatuses include a pixel unit including a plurality of pixels, a gate driver, a data driver, and a controller. The gate driver includes stages connected to gate lines, and the stages supply gate signals to gate lines connected to the stages in response to signals from the controller.

The above information disclosed in this Background section is only for enhancement of understanding of the background and therefore the information discussed in this Background section does not necessarily constitute prior art.

SUMMARY

Aspects of one or more embodiments relate to display apparatuses, and for example, to a gate driver for outputting a gate signal, and a display apparatus including the gate driver.

Aspects of one or more embodiments include a gate driver capable of outputting a gate signal, and a display apparatus including the gate driver.

Additional aspects will be set forth in portion in the description which follows and, in part, will be apparent from the description, or may be learned by practice of the presented embodiments of the disclosure.

According to one or more embodiments, a gate driver includes a plurality of stages, each including a first node controller configured to control respective voltage levels of a first node and a second node, a second node controller configured to control a voltage level of a third node, and a first output unit including a first pull-up transistor having a gate connected to the second node and outputting a gate signal of an on-voltage level, and a first pull-down transistor having a gate connected to the third node and outputting a gate signal of an off-voltage level. According to some embodiments, the first node controller includes a first control transistor connected between the first node and the second node, and the first control transistor includes a first gate and a second gate that are each connected to a first voltage input terminal for receiving a first voltage of an on-voltage level. According to some embodiments, the second node controller includes a second control transistor connected between the third node and a second voltage input terminal for receiving a second voltage of an off-voltage level, and the second control transistor includes a first gate connected to the first node and a second gate connected to the second voltage input terminal.

According to some embodiments, each of the plurality of stages may further include a second output unit including a second pull-up transistor having a gate connected to the second node and configured to output a carry signal of an on-voltage level, and a second pull-down transistor having a gate connected to the third node and configured to output a carry signal of an off-voltage level.

According to some embodiments, the first node controller may further include a first transistor connected between an input terminal to which a start signal is applied and the first node, and having a gate connected to a first clock terminal to which a first clock signal is applied, and a second transistor connected between the first node and the second voltage input terminal and having a gate connected to the third node.

According to some embodiments, the first transistor may include a $1\text{-}1^{st}$ transistor and a $1\text{-}2^{nd}$ transistor serially connected to each other, and the second transistor may include a $2\text{-}1^{st}$ transistor and a $2\text{-}2^{nd}$ transistor serially connected to each other.

According to some embodiments, each of the plurality of stages may further include a leakage blocking transistor having a gate connected to the first node, one end connected to the first voltage input terminal, and the other end connected to an intermediate node between the $1\text{-}1^{st}$ transistor and the $1\text{-}2^{nd}$ transistor and an intermediate node between the $2\text{-}1^{st}$ transistor and the $2\text{-}2^{nd}$ transistor.

According to some embodiments, the second node controller may further include a controller configured to control the third node to an on-voltage level state when the first node is in an off-voltage level state, and the second control transistor may be configured to control the third node to an off-voltage level state when the first node is in an on-voltage level state.

According to some embodiments, the controller may include a fifth transistor connected between a first clock terminal receiving a first clock signal and a fourth node, and including a first gate connected to the first node and a second gate connected to a third voltage input terminal to which a third voltage of an off-voltage level is applied, a sixth transistor connected between the first voltage input terminal and the fourth node and including a first gate and a second gate that are connected to the first clock terminal, a seventh transistor connected between the fourth node and a fifth node, and including a first gate connected to the first voltage input terminal and a second gate connected to the third voltage input terminal, a capacitor connected between the fifth node and a sixth node, an eighth transistor connected between a second clock terminal for receiving a second clock signal and the sixth node, and including a first gate connected to the fifth node and a second gate connected to the third voltage input terminal, and a ninth transistor connected between the first voltage input terminal and the third node and including a first gate and a second gate connected to the sixth node. According to some embodiments, the second voltage may be less than the third voltage, and the second clock signal may have a phase shifted by a predetermined time from the first clock signal.

According to some embodiments, a length of an off-voltage level of the start signal may be greater than a period of each of the first clock signal and the second clock signal.

According to some embodiments, the controller may include a fifth transistor connected between a first clock terminal for receiving a first clock signal and a fourth node and including a gate connected to the first node, a sixth transistor connected between the first voltage input terminal and the fourth node and including a gate connected to the first clock terminal, a seventh transistor connected between the fourth node and a fifth node and including a gate connected to the first voltage input terminal, a capacitor connected between the fifth node and a sixth node, an eighth transistor connected between a second clock terminal for receiving a second clock signal and the sixth node and including a gate connected to the fifth node, and a ninth transistor connected between the first voltage input terminal and the third node and including a gate connected to the sixth node. According to some embodiments, the second clock signal may have a phase shifted by a predetermined time from the first clock signal.

According to some embodiments, a length of an off-voltage level of the start signal may be greater than a period of each of the first clock signal and the second clock signal.

According to some embodiments, a timing at which the off-voltage level of the gate signal starts may be delayed relative to a timing at which an off-voltage level of the start signal starts by a predetermined time.

According to some embodiments, each of the plurality of stages may further include a transistor connected between the first node and a third voltage input terminal for receiving a third voltage of an off-voltage level, the transistor being configured to reset the first node. The transistor may include a pair of sub-transistors serially connected to each other, a gate of each of the sub-transistors may be connected to a reset terminal for receiving a reset signal, and the second voltage may be less than the third voltage.

According to some embodiments, each of the plurality of stages may further include a transistor connected between the first node and the second voltage input terminal, the transistor being configured to reset the first node. The transistor may include a pair of sub-transistors serially connected to each other, and a gate of each of the sub-transistors may be connected to a reset terminal for receiving a reset signal.

According to one or more embodiments, a gate driver includes a plurality of stages, each including a first node controller configured to control respective voltage levels of a first node and a second node, a second node controller configured to control a voltage level of a third node, and a first output unit including a first pull-up transistor and a first pull-down transistor, wherein the first pull-up transistor has a gate connected to the second node and is configured to output a gate signal of an on-voltage level, and the first pull-down transistor has a gate connected to the third node and is configured to output a gate signal of an off-voltage level. According to some embodiments, the first node controller includes a first control transistor connected between the first node and the second node, and the first control transistor includes a first gate and a second gate that are connected to a first voltage input terminal for receiving a first voltage of an on-voltage level. According to some embodiments, the second node controller includes a second control transistor connected between the third node and a second voltage input terminal for receiving a second voltage of an off-voltage level, the second control transistor includes a pair of sub-transistors serially connected to each other, and a first gate and a second gate of each of the sub-transistors are connected to the first node.

According to some embodiments, each of the plurality of stages may further include a second output unit including a second pull-up transistor and a second pull-down transistor, wherein the second pull-up transistor has a gate connected to the second node and is configured to output a carry signal of an on-voltage level, and the second pull-down transistor has a gate connected to the third node and is configured to output a carry signal of an off-voltage level.

According to some embodiments, the first node controller may further include a first transistor connected between an input terminal to which a start signal is applied and the first node, and having a gate connected to a first clock terminal to which a first clock signal is applied, and a second transistor connected between the first node and the second voltage input terminal and having a gate connected to the third node.

According to some embodiments, the first transistor may include a 1-$1^{st}$ transistor and a 1-$2^{nd}$ transistor serially connected to each other, and the second transistor may include a 2-$1^{st}$ transistor and a 2-$2^{nd}$ transistor serially connected to each other.

According to some embodiments, each of the plurality of stages may further include a leakage blocking transistor having a gate connected to the first node, having one end connected to the first voltage input terminal, and having the other end connected to an intermediate node between the 1-$1^{st}$ transistor and the 1-$2^{nd}$ transistor and an intermediate node between the 2-$1^{st}$ transistor and the 2-$2^{nd}$ transistor.

According to some embodiments, the second node controller may further include a controller configured to control the third node to an on-voltage level state when the first node is in an off-voltage level state, and the second control transistor may be configured to control the third node to an off-voltage level state when the first node is in an on-voltage level state.

According to some embodiments, the controller may include a fifth transistor connected between a first clock terminal for receiving a first clock signal and a fourth node and including a gate connected to the first node, a sixth transistor connected between the first voltage input terminal and the fourth node and including a gate connected to the first clock terminal, a seventh transistor connected between the fourth node and a fifth node and including a gate connected to the first voltage input terminal, a capacitor connected between the fifth node and a sixth node, an eighth transistor connected between a second clock terminal for receiving a second clock signal and the sixth node and including a gate connected to the fifth node, and a ninth transistor connected between the first voltage input terminal and the third node and including a gate connected to the sixth node. According to some embodiments, the second clock signal may have a phase shifted by a predetermined time from the first clock signal.

According to some embodiments, a length of an off-voltage level of the start signal may be greater than a period of each of the first clock signal and the second clock signal.

According to some embodiments, a timing at which the off-voltage level of the gate signal starts may be delayed relative to a timing at which an off-voltage level of the start signal starts by a predetermined time.

According to some embodiments, each of the plurality of stages may further include a transistor connected between the first node and a third voltage input terminal for receiving a third voltage of an off-voltage level, the transistor being configured to reset the first node. According to some embodiments, the transistor may include a pair of sub-transistors serially connected to each other, a gate of each of the sub-transistors may be connected to a reset terminal for receiving a reset signal, and the second voltage may be less than the third voltage.

According to some embodiments, each of the plurality of stages may further include a transistor connected between the first node and the second voltage input terminal, the transistor being configured to reset the first node. The transistor may include a pair of sub-transistors serially connected to each other, and a gate of each of the sub-transistors may be connected to a reset terminal for receiving a reset signal.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
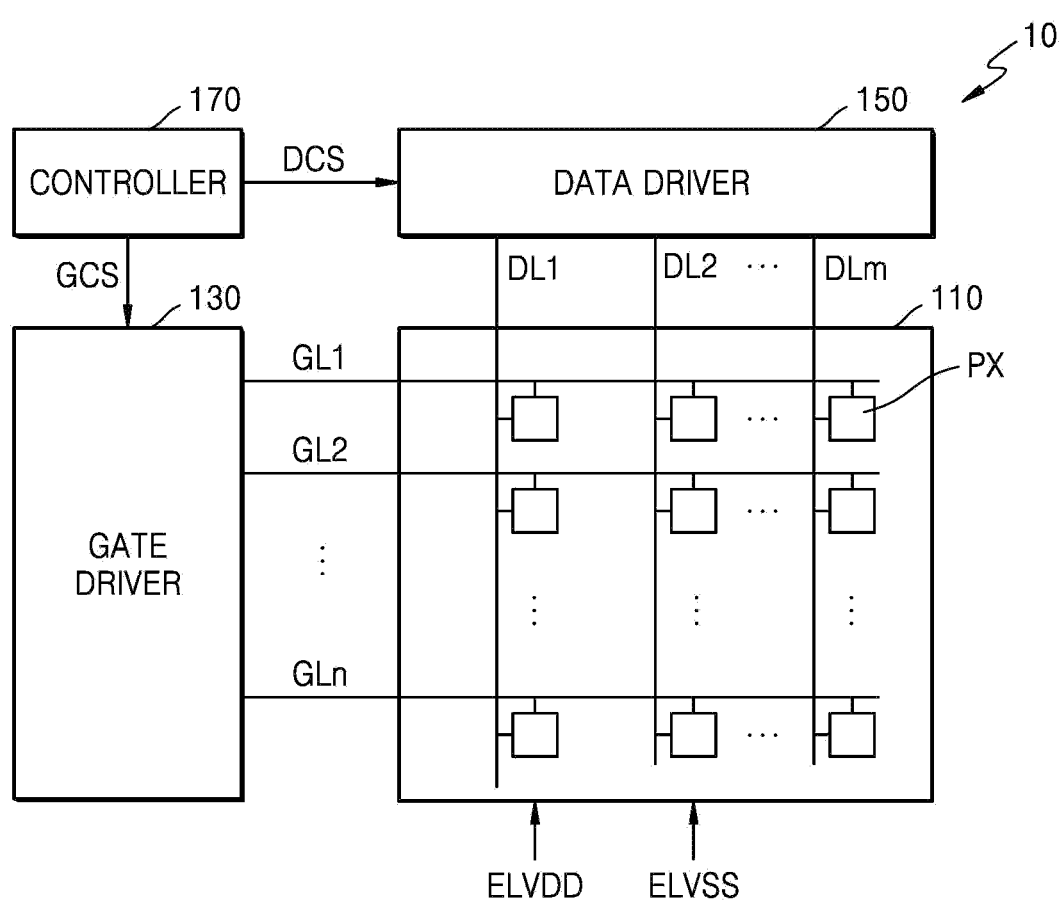
FIG. 1 is a schematic diagram of a display apparatus according to some embodiments.

Reference will now be made in more detail to aspects of some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Hereinafter, effects and features of the disclosure and a method for accomplishing them will be described more fully with reference to the accompanying drawings, in which embodiments of the present disclosure are shown. The disclosure may, however, be embodied in many different forms and should not be construed as limited to the embodiments set forth herein.

It will be understood that although the terms "first," "second," etc. may be used herein to describe various elements, these elements should not be limited by these terms. These elements are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. That is, for example, intervening layers, regions, or elements may be present.

Sizes of elements in the drawings may be exaggerated for convenience of explanation. For example, since sizes and thicknesses of elements in the drawings are arbitrarily illustrated for convenience of explanation, the following embodiments are not limited thereto.

In the present specification, "A and/or B" represents A or B, or A and B. The expression "at least one of A and B" indicates only A, only B, both A and B, or variations thereof.

When it is referred that X and Y are connected, it may include the case where X and Y are electrically connected, the case where X and Y are functionally connected, and the case where X and Y are directly connected. Here, X and Y may be objects (e.g., apparatuses, devices, circuits, wirings, electrodes, terminals, conductive layers, and layers). Therefore, connection is not limited to preset connection relationship, for example, connection relationship shown in the drawings or detailed descriptions, and may include other connections relationships not shown in the drawings or detailed descriptions.

The expression that X and Y are electrically connected may mean that at least one device (e.g., a switch, a transistor, a capacitance element, an inductor, a resistance element, a diode, etc.) that enables electrical connection of X and Y is connected between X and Y.

"ON" or "on" used in association with an element state may be referred to as an activated (turned-on) state of an element, and "OFF" or "off" may be referred to as an inactivated (turned-off) state of an element. "ON" or "on" used in association with a signal received by an element may be referred to as a signal for activating the element, and "OFF" or "off" may be referred to as a signal for inactivating the element. An element may be activated by a high-level voltage or a low-level voltage. For example, a P-type transistor is activated by a low-level voltage, and an N-type transistor is activated by a high-level voltage. Therefore, it should be understood that an "ON" voltage for a P-type transistor and an "ON" voltage for an N-type transistor have opposite (low versus high) voltage levels. Hereinafter, a voltage level that activates a transistor is referred to as an ON-voltage level, and a voltage level that inactivates a transistor is referred to as an OFF-voltage level.

FIG. 1 is a schematic diagram of a display apparatus according to some embodiments.

A display apparatus 10 according to embodiments may be implemented as an electronic apparatus such as a smartphone, a mobile phone, a smart watch, a navigation device, a game player, a TV, a vehicle head unit, a notebook computer, a laptop computer, a tablet computer, a personal media player (PMP), or a personal digital assistant (PDA). The electronic apparatus may be flexible.

Referring to FIG. 1, the display apparatus 10 according to some embodiments may include a display unit 110, a gate driver 130, a data driver 150, and a controller 170.

A plurality of pixels PX and signal lines capable of applying electrical signals to the plurality of pixels PX may be arranged in the display unit 110.

The plurality of pixels PX may be repeatedly arranged in a first direction (x direction, i.e., row direction) and a second direction (y direction, i.e., column direction). The plurality of pixels PX may be arranged in any of various configurations, such as a stripe configuration, a PenTile™ configuration, and a mosaic configuration, to display an image. Each of the plurality of pixels PX may include an organic light-emitting diode as a display element, and the organic light-emitting diode may be connected to a pixel circuit. The pixel circuit may include a plurality of transistors and at least one capacitor.

According to some embodiments, the plurality of transistors included in the display unit 110 may be N-type oxide thin-film transistors. For example, the oxide thin-film transistors may be low temperature polycrystalline oxide (LTPO) thin-film transistors. However, they are merely an example, and the N-type transistors are not limited thereto. For example, an active pattern (semiconductor layer) included in transistors may include an inorganic semiconductor (e.g., amorphous silicon or polycrystalline silicon) or an organic semiconductor.

The signal lines capable of applying electrical signals to the plurality of pixels PX may include a plurality of gate lines GL1, GL2, through to GLn that extend in the first direction, and a plurality of data lines DL1, DL2, through to DLm that extend in the second direction. The plurality of gate lines GL1, GL2, through to GLn may be spaced apart from each other in the second direction and configured to transfer gate signals to the pixels PX. The plurality of date lines DL1, DL2, through to DLm may be spaced apart from each other in the first direction and configured to transfer data signals to the pixels PX. Each of the plurality of pixels PX may be connected to at least one corresponding scan line among the plurality of gate lines GL1 through GLn and a corresponding data line among the plurality of data lines DL1 through DLm.

The gate driver 130 may be connected to the plurality of gate lines GL1 through GLn, may generate gate signals according to a gate driving control signal GCS from the controller 170, and may sequentially supply the gate signals to the plurality of gate lines GL1 through GLn. The plurality of gate lines GL1 through GLn may be connected to gate electrodes of the transistors included in the pixels PX, and the gate signals may control turn-on and turn-off operations of the transistors to which the gate lines are connected. A gate signal may be a square wave signal in which an on-voltage for turning on a transistor and an off-voltage for turning off the transistor are repeated According to some embodiments, the on-voltage may be a high-level voltage. A duration in which the on voltage of the gate signal is maintained (hereinafter, referred to as an 'on voltage duration') and a duration in which the off voltage of the gate signal is maintained (hereinafter, referred to as an 'off voltage duration') may depend on the function of a transistor receiving the gate signal within a pixel PX. The gate driver 130 may include a shift register (or a stage) that sequentially generates and outputs gate signals.

The data driver 150 may be connected to the plurality of data lines DL1 through DLm and may supply data signals to the data lines DL1 through DLm according to a data driving control signal DCS from the controller 170. The data signals supplied to the data lines DL1 through DLm may be supplied to the pixels PX to which gate signals are supplied.

When the display apparatus 10 is an organic light-emitting display apparatus, a first power supply voltage ELVDD and a second power supply voltage ELVSS may be supplied to the pixels PX of the display unit 110. The first power supply voltage ELVDD may be a high-level voltage provided to a first electrode (a pixel electrode or an anode) of the organic light-emitting diode of each pixel PX. The second power supply voltage ELVSS may be a low-level voltage provided to a second electrode (an opposite electrode or a cathode) of the organic light-emitting diode. The first power supply voltage ELVDD and the second power supply voltage ELVSS are driving voltages for enabling the plurality of pixels PX to emit light.

The controller 170 may generate a gate driving control signal GCS and a data driving control signal DCS, based on signals input received from an external source. The controller 170 may supply the gate driving control signal GCS to the gate driver 130, and may supply the data driving control signal DCS to the data driver 150.

Although pixels PX are connected to a single gate line in FIG. 1, this is merely an example, and the pixels PX may be connected to one or more gate lines. For example, the gate driver 130 may be connected to a plurality of first gate lines and a plurality of second gate lines, and may sequentially output first gate signals of an on voltage (on-voltage level) to the first gate lines during a first period of one frame time and sequentially output second gate signals of an on voltage to the second gate lines during a second period subsequent to the first period. The transistor connected to the first gate line of each pixel PX may be turned on during the first period, and the pixel PX may write a data signal thereto in response to a first gate signal and/or may compensate for a threshold voltage of a driving transistor. The transistor connected to the second gate line of each pixel PX may be turned on the second period, the driving transistor may output a driving current corresponding to the data signal, and the pixel PX may emit light with a brightness corresponding to the driving current. One frame (frame time) may be a section in which one frame image is displayed.

According to some embodiments, one gate driver 130 may generate the first gate signals and the second gate signals at different timings. According to some embodiments, a first gate driver that generates a first gate signal, and a second gate driver that generates a second gate signal may be configured independently from each other.

Figure 2:
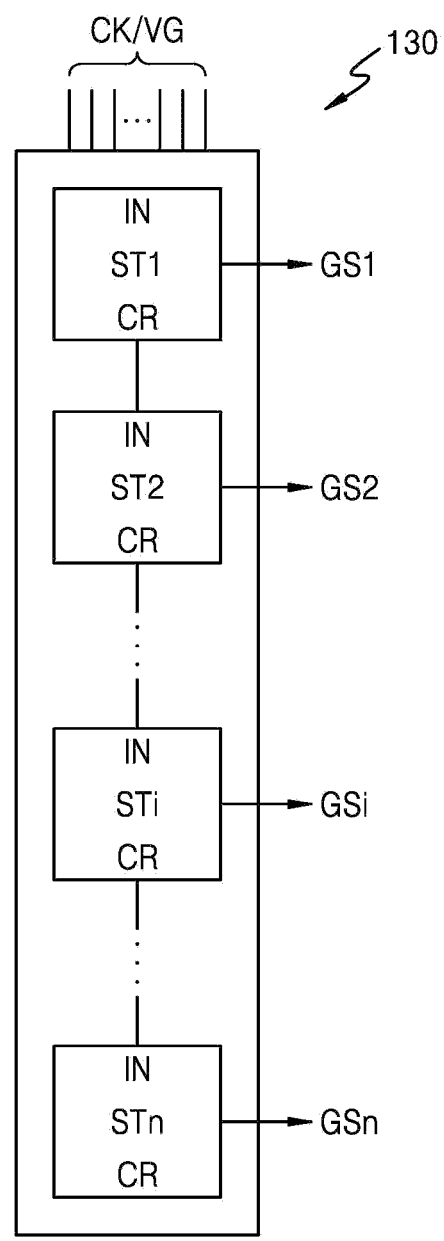
FIG. 2 is a schematic diagram of a gate driver according to some embodiments.

FIG. 2 is a schematic diagram of a gate driver according to some embodiments.

Referring to FIG. 2, the gate driver 130 may include a plurality of first through n-th stages ST1 through to STn. The plurality of first through n-th stages ST1 through STn may sequentially output gate signals GS1 through GSn to gate lines.

Each of the first through n-th stages ST1 through STn may be connected to the gate line on a corresponding row. Each of the first through n-th stages ST1 through STn may receive at least one clock signal CK and at least one voltage signal VG, generate a gate signal GS, and supply the gate signal GS to a gate line GL connected to each of the first through n-th stages ST1 through STn. For example, an i-th stage STi may supply a gate signal GSi to a gate line GL on an i-th row. In other words, each of the first through n-th stages ST1 through STn may supply the gate signal GS to the gate line GL provided on a corresponding row.

Each of the first through n-th stages ST1 through STn may receive at least one clock signal CK and at least one voltage signal VG and receive a carry signal CR from a previous stage (or receive a start signal) and supply a carry signal CR to a subsequent stage. The previous stage may be at least one stage before, and the later stage may be at least one stage after.

Figure 3:
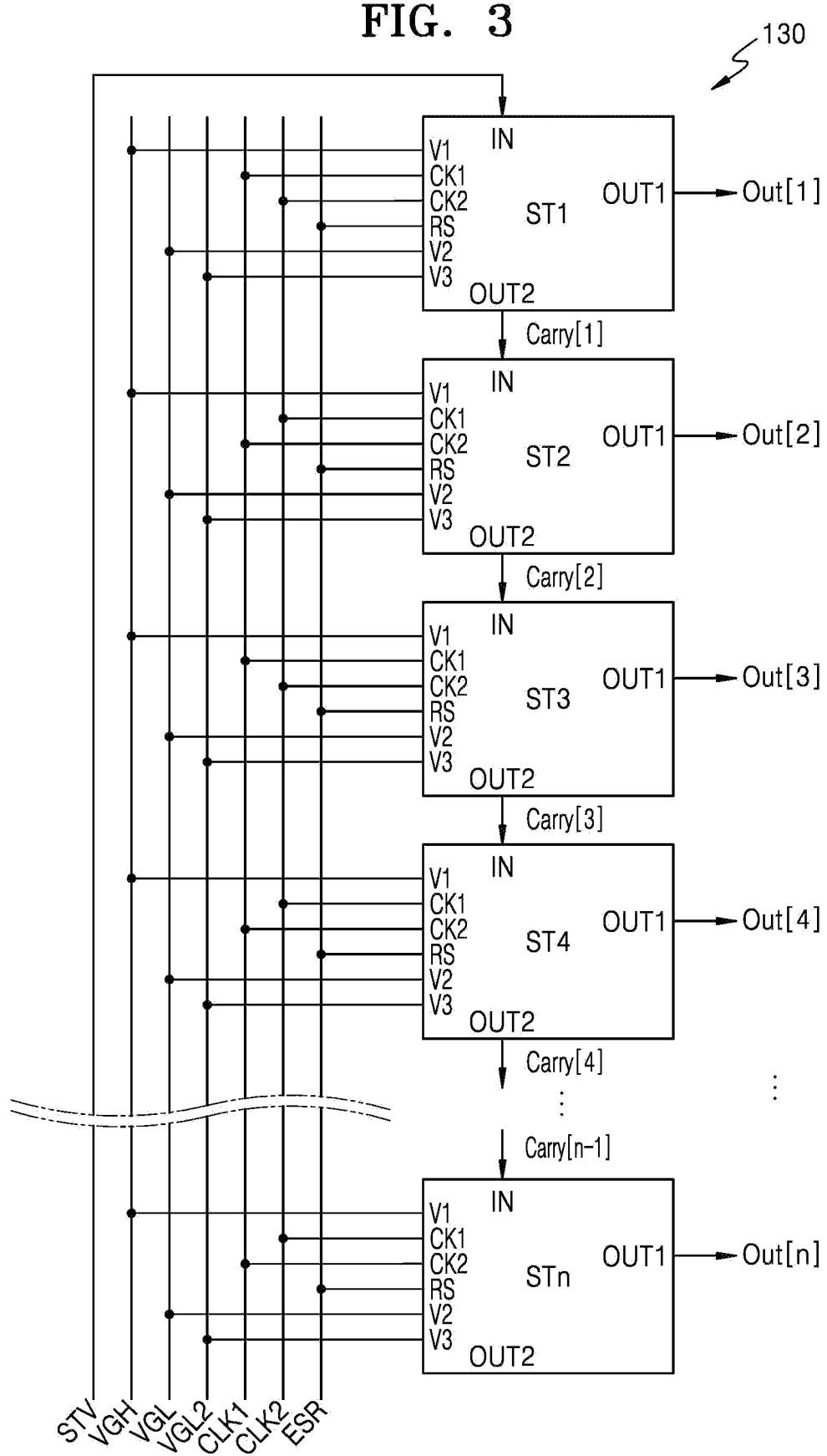
FIG. 3 is a schematic diagram of a gate driver according to some embodiments.
Figure 4:
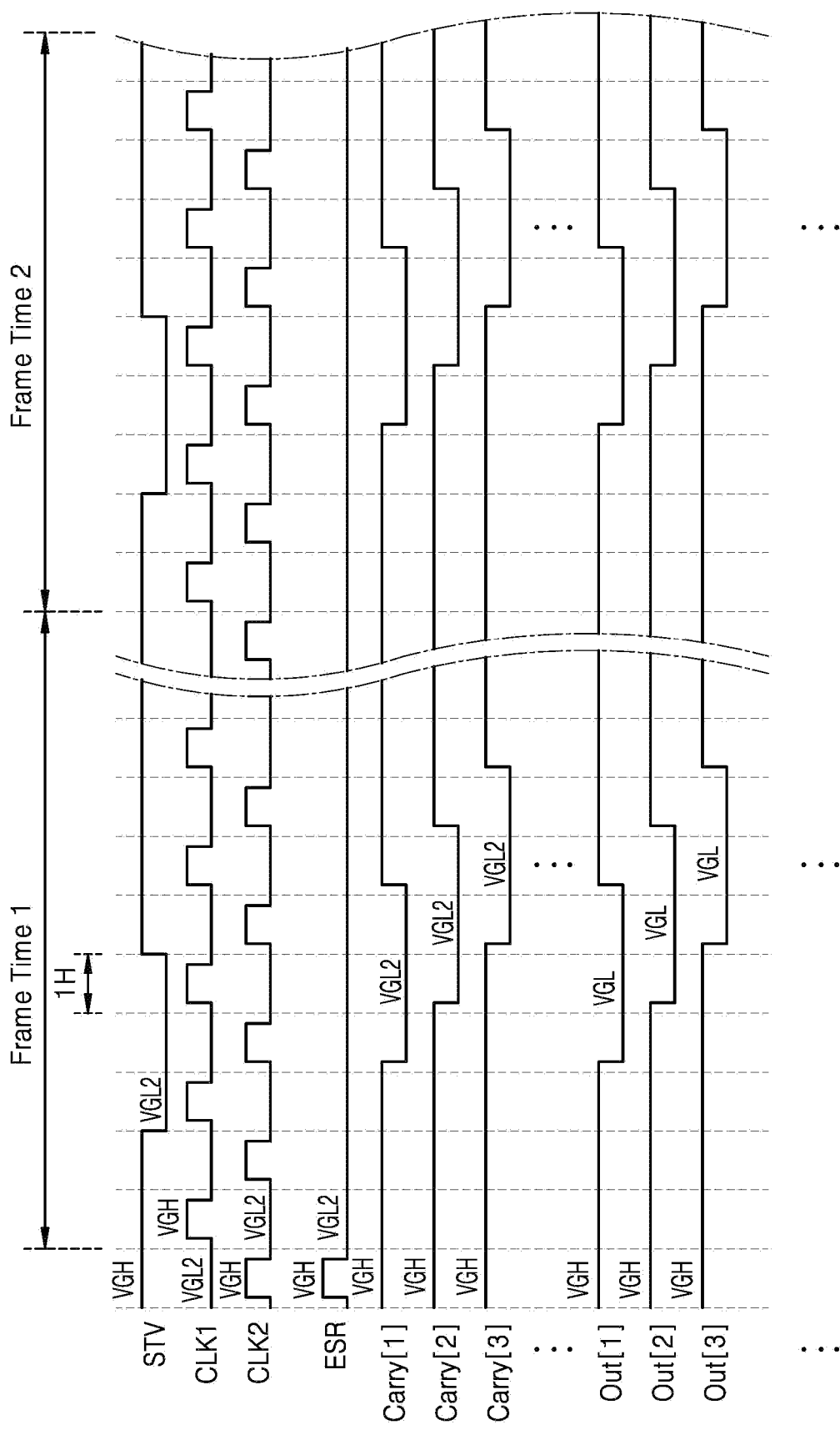
FIG. 4 is a timing diagram of input/output signals of the gate driver of FIG. 3 according to some embodiments.

FIG. 3 is a schematic diagram of a gate driver according to some embodiments. FIG. 4 is a timing diagram of input/output signals of the gate driver of FIG. 3.

Referring to FIG. 3, the gate driver 130 may include a plurality of first, second, third, fourth, through to n-th stages ST1, ST2, ST3, ST4, through to STn. The number of stages provided to the gate driver 130 may depend on the number of pixel rows in the display unit 110.

The plurality of first through n-th stages ST1 through STn may be configured to respectively provide first, second, third, fourth, through to n-th output signals Out[1], Out[2], Out[3], Out[4], through to Out[n] in response to a start signal. For example, the n-th stage STn may output the n-th output signal Out[n] to an n-th gate line. The first through n-th output signals Out[1] through to Out[n] may be the first through n-th gate signals GS1 through GSn of FIG. 2. An external signal STV, which is a start signal, may be supplied to the first stage ST1. The start signal may control timing of a first output signal Out[1], which is a first gate signal. An on-voltage may denote a high-level voltage, and an off-voltage may denote a low-level voltage.

Each of the plurality of first through n-th stages ST1 through STn may include an input terminal IN, a first clock terminal CK1, a second clock terminal CK2, a first voltage input terminal V1, a second voltage input terminal V2, a third voltage input terminal V3, a reset terminal RS, a first output terminal OUT1, and a second output terminal OUT2.

The input terminal IN may receive, as a start signal, an external signal STV or a previous carry signal. According to some embodiments, the external signal STV may be applied to the input terminal IN of the first stage ST1, and a previous carry signal output from a previous stage may be applied to the input terminal IN of each of the second through n-th stages ST2 through STn. For example, an (n–1)th carry signal Carry[n–1] may be output from an (n–1)th stage STn-1 and may be applied to the input terminal IN of the n-th stage STn. An off-voltage duration of the start signal may be 3H, which is longer than each of the period of the first clock signal CLK1 and the period of the second clock signal CLK2.

The first clock terminal CK1 and the second clock terminal CK2 may receive a first clock signal CLK1 or a second clock signal CLK2. The first clock signal CLK1 and the second clock signal CLK2 may be alternately applied to the first clock terminals CK1 of the first through n-th stages ST1 through STn. The second clock signal CLK2 and the first clock signal CLK1 may be alternately applied to the second clock terminals CK2 of the first through n-th stages ST1 through STn. For example, as shown in FIG. 3, the first clock signal CLK1 and the second clock signal CLK2 may be applied to the first clock terminal CK1 and the second clock terminal CK2 of the first stage ST1, respectively. The second clock signal CLK2 and the first clock signal CLK1 may be applied to the first clock terminal CK1 and the second clock terminal CK2 of the second stage ST2, respectively. The first clock signal CLK1 and the second clock signal CLK2 may be applied to the first clock terminal CK1 and the second clock terminal CK2 of the third stage ST3, respectively. The second clock signal CLK2 and the first clock signal CLK1 may be applied to the first clock terminal CK1 and the second clock terminal CK2 of the fourth stage ST4, respectively.

As shown in FIG. 4, the first clock signal CLK1 and the second clock signal CLK2 may be square wave signals in which a first voltage VGH of a high level and a third voltage VGL2 of a low level are repeated. The period of each of the first clock signal CLK1 and the second clock signal CLK2 may be 2H including one time of a high level and one time of a low level. The first clock signal CLK1 and the second clock signal CLK2 may have the same waveform and may have a phase difference. For example, the second clock signal CLK2 may be applied with the same waveform as that of the first clock signal CLK1 and with a preset phase shift/difference (phase delay) from the first clock signal CLK1 at preset intervals (about one horizontal period (1H)). An on-voltage duration of the first clock signal CLK1 supplied through a first clock signal line and an on-voltage duration of the second clock signal CLK2 supplied through a second clock signal line may not overlap with each other. The length of the on-voltage duration of each of the first clock signal CLK1 and the second clock signal CLK2 may be equal to 1H or may be a preset length less than 1H.

The reset terminal RS may receive a reset signal ESR. The reset signal ESR may be supplied as an on-voltage level of the first voltage VGH at a preset timing, and may be supplied as an off-voltage level of the third voltage VGL2 at other timings. For example, when power is applied to a display apparatus (i.e., when the display apparatus is powered on), the reset signal ESR may be supplied as the first voltage VGH to the first through n-th stages ST1 through STn for a preset time, and, when the preset time elapses, the reset signal ESR may be supplied as the third voltage VGL2 to the first through n-th stages ST1 through STn.

The first voltage input terminal V1 may receive the first voltage VGH, the second voltage input terminal V2 may receive a second voltage VGL, and the third voltage input terminal V3 may receive the third voltage VGL2. The third voltage VGL2 may have a lower voltage level than that of the second voltage VGL.

The first voltage VGH, the second voltage VGL, and the third voltage VGL2, which are global signals, may be supplied from the controller 170 shown in FIG. 1 and/or a power supply.

An output signal output from the first output terminal OUT1 may be a gate signal. Two consecutive ones of the first, second, third, fourth, through to n-th output signals Out[1], Out[2], Out[3], Out[4], through to Out[n] output from the first output terminals OUT1 of the first through n-th stages ST1 through STn may be shifted by a 1 horizontal period 1H. Each output signal may be supplied to a pixel through a corresponding output line, for example, a corresponding gate line. The length of each of respective off-voltage durations of the first, second, third, fourth, through to n-th output signals Out[1], Out[2], Out[3], Out[4], through to Out[n] may be equal to the length of the off-voltage duration of the start signal.

An output signal output from the second output terminal OUT2 may be a carry signal. Two consecutive ones of carry signals Carry[1], Carry[2], Carry[3], Carry[4], through to Carry[n] output from the second output terminals OUT2 of the first through n-th stages ST1 through STn may be shifted by the 1 horizontal period 1H. The length of each of respective off-voltage durations of the carry signals Carry[1], Carry[2], Carry[3], Carry[4], through to Carry[n] may be equal to the length of the off-voltage duration of the start signal.

The start of the off-voltage of each of the carry signals Carry[1], Carry[2], Carry[3], Carry[4], through to Carry[n] and each of the output signals Out[1], Out[2], Out[3], Out[4], through to Out[n] may be sequentially shifted by 1H from the start of the off-voltage of the start signal.

The off-voltage duration of an output signal output by each of the first output terminals OUT1 of the first through n-th stages ST1 through STn, and the off-voltage duration of a carry signal output by each of the second output terminals OUT2 of the first through n-th stages ST1 through STn may overlap with each other.

According to some embodiments, at least one dummy stage may be further provided at the rear of the last stage STn among the plurality of first through n-th stages ST1 through STn. A carry signal output by the second output terminal OUT2 of the n-th stage STn may be applied to an input terminal of the dummy stage. The dummy stage may not be connected to the gate line of the display unit 110 of FIG. 1. In some embodiments, the dummy stage may be connected to a dummy gate line.

However, the dummy gate line is connected to a dummy pixel that does not display an image, and the dummy stage is not used to display an image. In some embodiments, the dummy pixel may be omitted and only the dummy gate line may be provided around the display unit 110.

Figure 5:
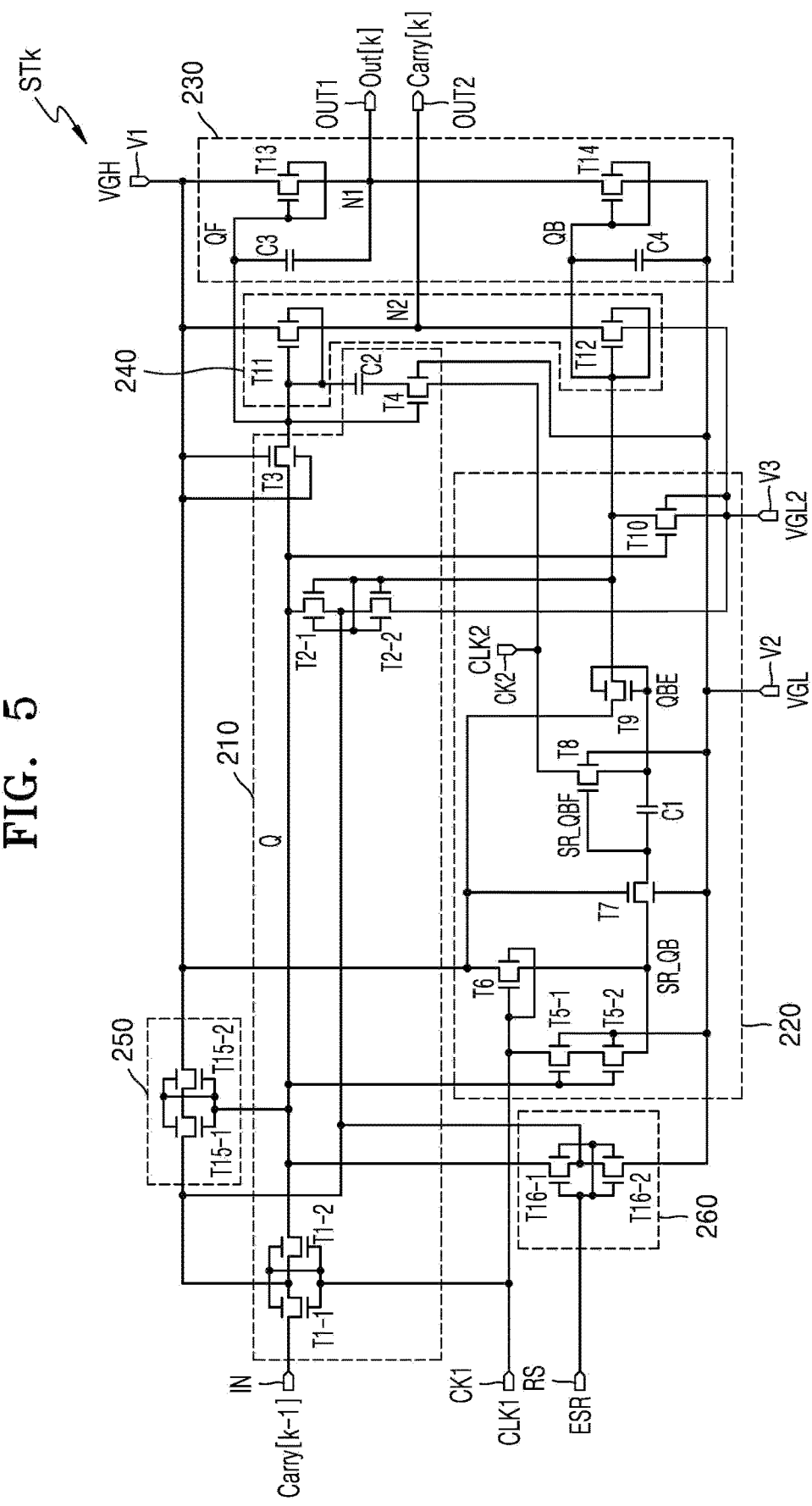
FIG. 5 is a circuit diagram of a stage included in the gate driver of FIG. 3 according to some embodiments.

FIG. 5 is a circuit diagram of an arbitrary stage included in the gate driver 130 of FIG. 3.

Each of the first through n-th stages ST1 through STn has a plurality of nodes. Hereinafter, some of the plurality of nodes are referred to as first and second output nodes N1 and N2 and first through third nodes Q, QF, and QB.

A k-th stage STk (where k is a natural number greater than 0 and less than n) shown in FIG. 5 may output an output signal Out[k], which is a gate signal, to a k-th pixel row of the display unit 110, and may output a carry signal Carry[k] to a (k+1)th stage after the k-th stage STk. An embodiment where the k-th stage STk is an odd-numbered stage will now be described. According to some embodiments, a voltage level (on-voltage level) of the on voltage is a high level, and a voltage level (off-voltage level) of the off voltage is a low level.

The k-th stage STk may include a first node controller 210, a second node controller 220, a first output unit 230, a second output unit 240, a leakage controller 250, and a reset unit 260. Each of the first node controller 210, the second node controller 220, the first output unit 230, the second output unit 240, the leakage controller 250, and the reset unit 260 may include at least one transistor. The at least one transistor may be an N-type transistor. The at least one transistor may be an N-type oxide semiconductor transistor. A gate of the at least one transistor may include a first gate and a second gate. According to some embodiments, the at least one transistor may be a dual gate transistor including a first gate serving as a top gate located over a semiconductor and a second gate serving as a bottom gate located under the semiconductor.

A previous carry signal Carry[k−1] may be supplied as a start signal to the input terminal IN, the first clock signal CLK1 may be supplied to the first clock terminal CK1, the second clock signal CLK2 may be supplied to the second clock terminal CK2, the first voltage VGH may be supplied to the first voltage input terminal V1, the second voltage VGL may be supplied to the second voltage input terminal V2, the third voltage VGL2 may be supplied to the third voltage input terminal V3, and the reset signal ESR may be supplied to the reset terminal RS. The external signal STV may be supplied as a start signal to the input terminal IN of the first stage when k=1.

The first node controller 210 may be connected between the input terminal IN and the second node QF. The first node controller 210 may be configured to control voltages of the first node Q and the second node QF, based on the previous carry signal Carry[k−1], the first clock signal CLK1, and the second clock signal CLK2, the previous carry signal Carry[k−1] being a start signal supplied to the input terminal IN, the first clock signal CLK1 being supplied to the first clock terminal CK1, and the second clock signal CLK2 being supplied to the second clock terminal CK2. The first node controller 210 may include a first transistor T1, a second transistor T2, a third transistor T3, and a fourth transistor T4. The first node controller 210 may further include a second capacitor C2.

The first transistor T1 may include a 1-$1^{st}$ transistor T1-1 and a 1-$2^{nd}$ transistor T1-2 connected in series between the input terminal IN and the first node Q. First gates and second gates of the 1-$1^{st}$ transistor T1-1 and the 1-$2^{nd}$ transistor T1-2 may be connected to the first clock terminal CK1. The first transistor T1 may be turned on when the first clock signal CLK1 is a high-level voltage, and may be configured to control the voltage level of the first node Q according to the voltage of the previous carry signal Carry[k−1].

The second transistor T2 may include a 2-$1^{st}$ transistor T2-1 and a 2-$2^{nd}$ transistor T2-2 connected in series between the first node Q and a third voltage input terminal V3. First gates and second gates of the 2-$1^{st}$ transistor T2-1 and the 2-$2^{nd}$ transistor T2-2 may be connected to the third node QB. The second transistor T2 may be a control transistor that controls the first node Q to a low-level state when the third node QB is in a high-level state. The second transistor T2 may be turned on when the third node QB is in a high-level state, and may control the voltage level of the first node Q to a voltage level of the third voltage VGL2 applied to the third voltage input terminal V3.

The third transistor T3 may be connected between the first node Q and the second node QF. A first gate and a second gate of the third transistor T3 may be connected to the first voltage input terminal V1. The third transistor T3 may be a control transistor that controls the voltage level of the second node QF by connecting the first node Q to the second node QF. The third transistor T3 may be always turned on by the first voltage VGH applied to the first voltage input terminal V1, to prevent a line voltage drop and the like between the first node Q and the second node QF. Thus, an on voltage of the output signal Out[k] may be stably output.

The fourth transistor T4 may be connected between the second clock terminal CK2 and the second capacitor C2. A first gate of the fourth transistor T4 may be connected to the second node QF to be controlled by the voltage level of the second node QF. A second gate of the fourth transistor T4 may be connected to the second voltage input terminal V2 to receive the second voltage VGL. The fourth transistor T4 may be turned on when the second node QF is in a high level state, to transmit, to one end of the second capacitor C2, the second clock signal CLK2 supplied to the second clock terminal CK2.

The second capacitor C2 may be connected between the second node QF and the fourth transistor T4. When the second clock signal CLK2 is in a high-level voltage, the second node QF may be boosted to a greater voltage (for example, twice the first voltage VGH) than the first voltage VGH by the turned-on fourth transistor T4 and the second capacitor C2.

The second node controller 220 may be connected between the first node Q and the third node QB. The second node controller 220 may control the voltage of the third node QB by inverting the voltage of the first node Q and supplying a result of the inversion to the third node QB. The second node controller 220 may control the voltage of the third node QB, based on the first clock signal CLK1 and the second clock signal CLK2, the first clock signal CLK1 being supplied to the first clock terminal CK1 and the second clock signal CLK2 being supplied to the second clock terminal CK2.

The second node controller 220 may include a 2-$1^{st}$ node controller that controls the third node QB to a high-level state when the first node Q is in a low-level state, and a 2-$2^{nd}$ node controller that controls the third node QB to a low-level state when the first node Q is in a high-level state. The 2-$1^{st}$ node controller may include a fifth transistor T5, a sixth transistor T6, a seventh transistor T7, an eighth transistor T8, a ninth transistor T9, and a first capacitor C1. The 2-$2^{nd}$ node controller may include a tenth transistor T10.

The fifth transistor T5 may include a 5-$1^{st}$ transistor T5-1 and a 5-$2^{nd}$ transistor T5-2 connected in series between the first clock terminal CK1 and a fourth node SR_QB. First gates of the 5-$1^{st}$ transistor T5-1 and the 5-$2^{nd}$ transistor T5-2 may be connected to the first node Q and may be controlled by the voltage level of the first node Q. Second gates of the 5-$1^{st}$ transistor T5-1 and the 5-$2^{nd}$ transistor T5-2 may be connected to the second voltage input terminal V2 to receive the second voltage VGL. The fifth transistor T5 may be turned on when the first node Q is in a high-level state, to transmit to the fourth node SR_QB the first clock signal CLK1 applied to the first clock terminal CK1.

The sixth transistor T6 may be connected between the first voltage input terminal V1 and the fourth node SR_QB. A first gate and a second gate of the sixth transistor T6 may be connected to the first clock terminal CK1 and may be controlled by the voltage level of the first clock signal CLK1. The sixth transistor T6 may be turned on when the first clock signal CLK1 is in a high level, to transmit to the fourth node SR_QB the first voltage VGH applied to the first voltage input terminal V1.

The seventh transistor T7 may be connected between the fourth node SR_QB and a fifth node SR_QBF. A first gate of the seventh transistor T7 may be connected to the first voltage input terminal V1 to receive the first voltage VGH. A second gate of the seventh transistor T7 may be connected to the second voltage input terminal V2 to receive the second voltage VGL. The seventh transistor T7 may be always turned on by the first voltage VGH to transmit the voltage of the fourth node SR_QB to the fifth node SR_QBF.

The eighth transistor T8 may be connected between the second clock terminal CK2 and a sixth node QBE. A first gate of the eighth transistor T8 may be connected to the fifth node SR_QBF and may be controlled by the voltage level of the fifth node SR_QBF. A second gate of the eighth transistor T8 may be connected to the second voltage input terminal V2 to receive the second voltage VGL. The eighth transistor T8 may be turned on when the fifth node SR_QBF is in a high-level state, to transmit to the sixth node QBE the second clock signal CLK2 applied to the second clock terminal CK2.

The ninth transistor T9 may be connected between the first voltage input terminal V1 and the third node QB. A first gate and a second gate of the ninth transistor T9 may be connected to the sixth node QBE and may be controlled by the voltage level of the sixth node QBE. The ninth transistor T9 may be turned on when the sixth node QBE is in a high level state, to transmit to the third node QB the first voltage VGH applied to the first voltage input terminal V1.

The tenth transistor T10 may be connected between the third node QB and the third voltage input terminal V3. A first gate of the tenth transistor T10 may be connected to the first node Q and may be controlled by the voltage level of the first node Q. A second gate of the tenth transistor T10 may be connected to the third voltage input terminal V3 to receive the third voltage VGL2. The tenth transistor T10 may be turned on when the first node Q is in a high level state, to transmit to the third node QB the third voltage VGL2 applied to the third voltage input terminal V3. The tenth transistor T10 may be a control transistor that controls the voltage level of the third node QB.

The first capacitor C1 may be connected between the fifth node SR_QBF and the sixth node QBE. When the second clock signal CLK2 is in a high-level voltage, the fifth node SR_QBF may be boosted to a greater voltage (for example, twice the first voltage VGH) than the first voltage VGH by the turned-on eighth transistor T8 and the first capacitor C1.

The first output unit 230 may output an output signal of an on-voltage level or an output signal of an off-voltage level according to the voltage levels of the second node QF and the third node QB. The first output unit 230 may transmit the first voltage VGH or the second voltage VGL to the first output terminal OUT1 connected to the first output node N1 according to the voltage levels of the second node QF and the third node QB. A high-level voltage of the first voltage VGH or a low-level voltage of the second voltage VGL may be output as an output signal Out[k] from the first output terminal OUT1. The first output unit 230 may include a thirteenth transistor T13 and a fourteenth transistor T14. The first output unit 230 may further include a third capacitor C3 and a fourth capacitor C4.

The thirteenth transistor T13 may be connected between the first voltage input terminal V1 and the first output node N1. A first gate and a second gate of the thirteenth transistor T13 may be connected to the second node QF. The thirteenth transistor T13 may be turned on or turned off in correspondence with the voltage level of the second node QF. The thirteenth transistor T13 may be a pull-up transistor for outputting a high-level voltage. The thirteenth transistor T13 may be turned on when the second node QF is in a high level state, to transmit to the first output terminal OUT1 the first voltage VGH received from the first voltage input terminal V1.

The fourteenth transistor T14 may be connected between the first output node N1 and the second voltage input terminal V2. A first gate and a second gate of the fourteenth transistor T14 may be connected to the third node QB. The fourteenth transistor T14 may be turned on or turned off in correspondence with the voltage level of the third node QB. The fourteenth transistor T14 may be a pull-down transistor for outputting a low-level voltage. The fourteenth transistor T14 may be turned on when the third node QB is in a high level state, to transmit to the first output terminal OUT1 the second voltage VGL received from the second voltage input terminal V2.

The third capacitor C3 may be connected between the second node QF and the first output node N1. The voltage of the second node QF may be bootstrapped by the third capacitor C3. The fourth capacitor C4 may be connected between the third node QB and the first output node N1.

The second output unit 240 may output a carry signal of an on-voltage level or a carry signal of an off-voltage level according to the voltage levels of the second node QF and the third node QB. The second output unit 240 may output the first voltage VGH or the third voltage VGL2 as the carry signal Carry[k] to the second output terminal OUT2 connected to the second output node N2 according to the voltage levels of the second node QF and the third node QB. The second output unit 240 may include an eleventh transistor T11 and a twelfth transistor T12.

The eleventh transistor T11 may be connected between the first voltage input terminal V1 and the second output node N2. A first gate and a second gate of the eleventh transistor T11 may be connected to the second node QF. The eleventh transistor T11 may be turned on or turned off in correspondence with the voltage level of the second node QF. The eleventh transistor T11 may be a pull-up transistor for outputting a high-level voltage. The eleventh transistor T11 may be turned on when the second node QF is in a high level state, to transmit to the second output terminal OUT2 the first voltage VGH received from the first voltage input terminal V1.

The twelfth transistor T12 may be connected between the second output node N2 and the third voltage input terminal V3. A first gate and a second gate of the twelfth transistor T12 may be connected to the third node QB. The twelfth transistor T12 may be turned on or turned off in correspondence with the voltage level of the third node QB. The twelfth transistor T12 may be a pull-down transistor for outputting a low-level voltage. The twelfth transistor T12 may be turned on when the third node QB is in a high level state, to transmit to the second output terminal OUT2 the third voltage VGL2 received from the third voltage input terminal V3.

The leakage controller 250 may block a leakage current to the first node Q of transistors connected to the first node Q (for example, the first transistor T1, the second transistor T2, and the sixteenth transistor T16) connected to the first node Q when the first node Q is in a high-level state. The leakage controller 250 may include a fifteenth transistor T15 (leakage blocking transistor), and the fifteenth transistor T15 may include a 15-$1^{st}$ transistor T15-1 and a 15-$2^{nd}$ transistor T15-2 connected to each other in series. First gates and second gates of the 15-$1^{st}$ transistor T15-1 and the 15-$2^{nd}$ transistor T15-2 may be connected to the first node Q. One end of the fifteenth transistor T15 may be connected to the first voltage input terminal V1. The other end of the fifteenth transistor T15 may be connected to an intermediate node (common electrode) between the 1-$1^{st}$ transistor T1-1 and the 1-$2^{nd}$ transistor T1-2, an intermediate node (common electrode) between the 2-$1^{st}$ transistor T2-1 and the 2-$2^{nd}$ transistor T2-2, and an intermediate node (common electrode) between a 16-$1^{st}$ transistor T16-1 and a 16-$2^{nd}$ transistor T16-2. The fifteenth transistor T15 may be turned on when the first node Q is in a high-level state, and may minimize current leakage of the first node Q by maintaining the intermediate nodes of the first transistor T1, the second transistor T2, and the sixteenth transistor T16 in a high-level state.

The reset unit 260 may reset the first node Q, based on the reset signal ESR supplied to the reset terminal RS. The reset unit 260 may include a sixteenth transistor T16 (reset transistor), and the sixteenth transistor T16 may include a 16-$1^{st}$ transistor T16-1 and a 16-$2^{nd}$ transistor T16-2 connected to each other in series between the first node Q and the second voltage input terminal V2. First gates and second gates of the 16-$1^{st}$ transistor T16-1 and the 16-$2^{nd}$ transistor T16-2 may be connected to the reset terminal RS. The sixteenth transistor T16 may be turned on when the reset signal ESR is applied as a high-level pulse to the reset terminal RS, to reset (initialize) the first node Q to the second voltage VGL.

Figure 6:
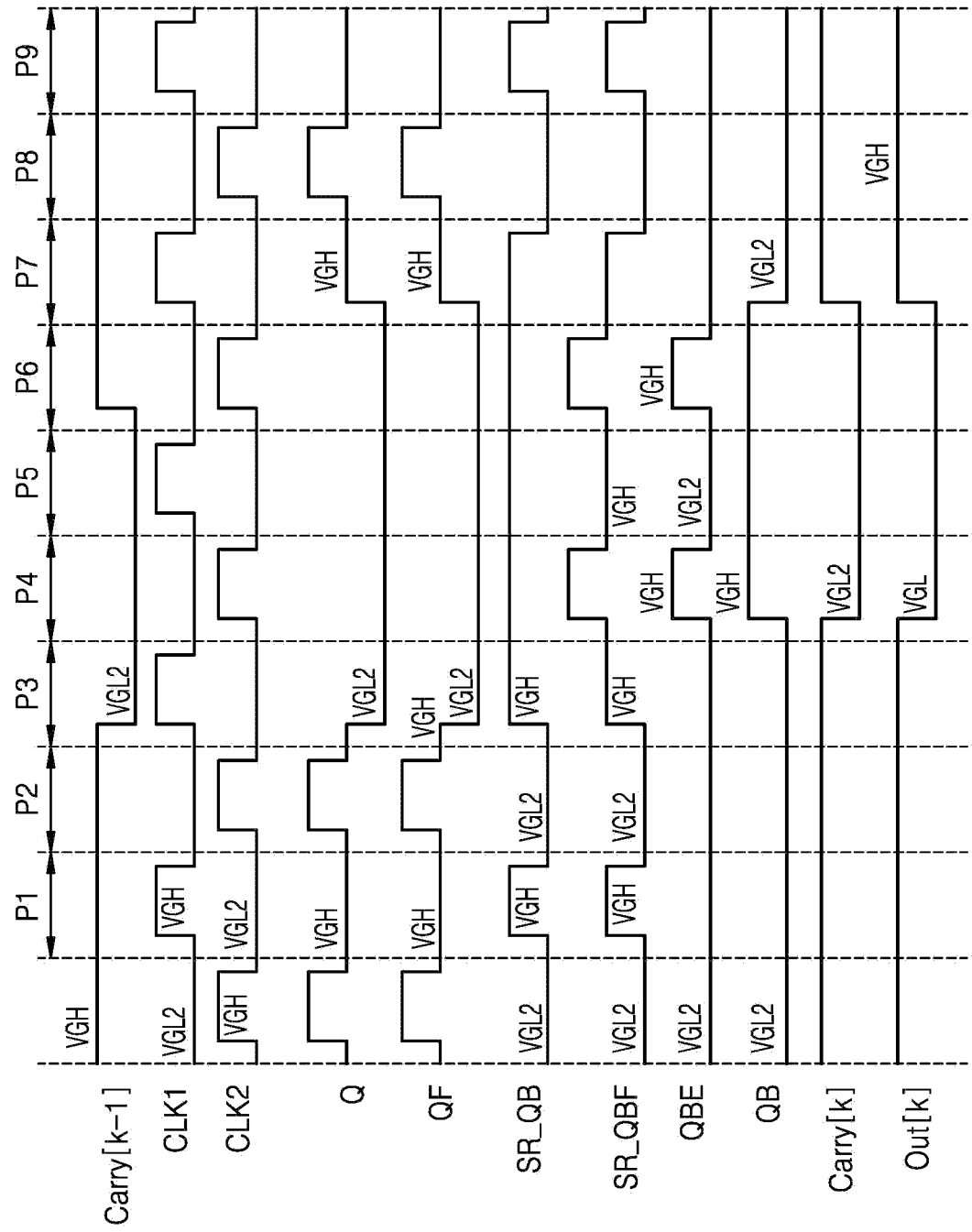
FIG. 6 is a timing diagram for explaining a method of driving the stage of FIG. 5 according to some embodiments.

FIG. 6 is a waveform diagram of an example of an operation of the stage STk of FIG. 5.

A width of each of first through ninth sections P1 through P9 may be the 1 horizontal period 1H. FIG. 6 illustrates the previous carry signal Carry[k−1]), which serves as the start signal, the first clock signal CLK1, the second clock signal CLK2, respective node voltages of the first through sixth nodes Q, QF, QB, SR_QB, SR_QBF, and QBE, the carry signal Carry[k]), and the output signal Out[k]. For convenience of explanation, the voltage level of the first voltage VGH will now be expressed as a high level, and the voltage levels of the second voltage VGL and the third voltage VGL2 will now be expressed as low levels. A high-level voltage may be defined as an on voltage, and a low-level voltage may be defined as an off voltage.

In the first section P1, the previous carry signal Carry[k−1] received from a previous stage may be a high-level voltage, the first clock signal CLK1 input to the first clock terminal CK1 may be a high-level voltage, and the second clock signal CLK2 input to the second clock terminal CK2 may be a low-level voltage.

The first transistor T1 may be turned on by the first clock signal CLK1. The previous carry signal Carry[k−1] may be transmitted to the first node Q by the turned-on first transistor T1 so that the first node Q is in a high-level state, the first node Q and the second node QF may be connected to each other by the turned-on third transistor T3, and the second node QF may be in a high-level state. Because the first node Q is in a high-level state, the fifth transistor T5 and the tenth transistor T10 may be turned on. The third voltage VGL2 may be transmitted to the third node QB by the turned-on tenth transistor T10 so that the third node QB is in a low-level state. Thus, the thirteenth transistor T13 and the eleventh transistor T11 of which respective gates are connected to the second node QF may be turned on, and the second output terminal OUT2 and the first output terminal OUT1 may be each in a high-level state, and may output the carry signal Carry[k] of a high level and the output signal Out[k] of a high level.

The first voltage VGH may be transmitted to the fourth node SR_QB by the first node Q in a high-level state and the fifth transistor T5 and the sixth transistor T6 turned on by the first clock signal CLK1 of a high-level voltage, and thus the fourth node SR_QB may be in a high-level state. The fifth node SR_QBF may be in a high-level state by the seventh transistor T7 turned on by the first voltage VGH. Because the fifth node SR_QBF is in a high-level state, the eighth transistor T8 may be turned on, and the second clock signal CLK2 may be transmitted to the sixth node QBE so that the sixth node QBE may be in a low-level state.

In the second section P2, the previous carry signal Carry[k−1] may be a high-level voltage, the first clock signal CLK1 input to the first clock terminal CK1 may be a low-level voltage, and the second clock signal CLK2 input to the second clock terminal CK2 may be a high-level voltage.

The first transistor T1 may be turned off by the first clock signal CLK1 so that the first node Q and the second node QF are each in a floating state, and the second node QF may be maintained in a high-level state by the second capacitor C2 and the third capacitor C3, which are boost capacitors. In this case, the second node QF may be maintained in a greater high-level voltage than the high-level voltage in the first section P1 by the second capacitor C2 and the third capacitor C3. Thus, the thirteenth transistor T13 and the eleventh transistor T11 may maintain a turned-on state, and may output the output signal Out[k] of a high level and the carry signal Carry[k] of a high level. The third node QB may be maintained in a low-level state by the turned-on tenth transistor T10.

The sixth transistor T6 may be turned off by the first clock signal CLK1, and the first clock signal CLK1 of a low level may be transmitted to the fourth node SR_QB by the turned-on fifth transistor T5 so that the fourth node SR_QB may be in a low-level state. Thus, the fifth node SR_QBF may be in a low-level state by the turned-on seventh transistor T7 so that the eighth transistor T8 is turned off, and the sixth node QBE may be maintained in a low-level state.

In the third section P3, the previous carry signal Carry [k−1] may transit to a low-level voltage, the first clock signal CLK1 may be a high-level voltage, and the second clock signal CLK2 may be a low-level voltage.

The first transistor T1 and the sixth transistor T6 may be turned on by the first clock signal CLK1. The previous carry signal Carry[k−1] may be transmitted to the first node Q by the turned-on first transistor T1 so that the first node Q is in a low-level state, and the second node QF may be in a low-level state by the turned-on third transistor T3. Because the first node Q is in a low-level state, the fifth transistor T5 and the tenth transistor T10 may be turned off. Because the second node QF is in a low-level state, the thirteenth transistor T13 and the eleventh transistor T11 may be turned off. The first voltage VGH may be transmitted to the fourth node SR_QB by the turned-on sixth transistor T6 so that the fourth node SR_QB is in a high-level state, and the fifth node SR_QBF may be in a high-level state by the turned-on seventh transistor T7. Because the fifth node SR_QBF is in a high-level state, the eighth transistor T8 may be turned on, and the second clock signal CLK2 may be transmitted to the sixth node QBE so that the sixth node QBE may be in a low-level state. The ninth transistor T9 may be turned off so that the third node QB is in a floating state and maintains a low-level state.

The first output terminal OUT1 and the second output terminal OUT2 may each maintain a high-level state as in the second section P2, and may output the output signal Out[k] of a high level and the carry signal Carry[k] of a high level, respectively.

In the fourth section P4, the previous carry signal Carry [k−1] may be a low-level voltage, the first clock signal CLK1 may be a low-level voltage, and the second clock signal CLK2 may be a high-level voltage.

The first transistor T1 may be turned off by the first clock signal CLK1, the first node Q and the second node QF may each maintain a low-level state, and the thirteenth transistor T13 and the eleventh transistor T11 may be turned off. The sixth transistor T6 may be turned off by the first clock signal CLK1, and, because the first node Q is in a low level state, the fifth transistor T5 may be turned off and the fourth node SR_QB may maintain a high-level state. Thus, the fifth node SR_QBF may be in a high-level state by the turned-on seventh transistor T7, and accordingly, the eighth transistor T8 may be turned on, and the sixth node QBE may be in a high-level state by the second clock signal CLK2. At this time, the fifth node SR_QBF may be maintained in a greater high-level voltage than the high-level voltage in the third section P3 by the first capacitor C1. The ninth transistor T9 may be turned on, and the third node QB may be in a high-level state by the first voltage VGH. Thus, the fourteenth transistor T14 may be turned on so that the second voltage VGL of a low level is transmitted to the first output node N1, and thus the output signal Out[k] of a low level may be output from the first output terminal OUT1. The twelfth transistor T12 may be turned on so that the third voltage VGL2 of a low level is transmitted to the second output node N2, and thus the carry signal Carry[k] of a low level may be output from the second output terminal OUT2.

In the fifth section P5, the previous carry signal Carry[k−1] may be a low-level voltage, the first clock signal CLK1 may be a high-level voltage, and the second clock signal CLK2 may be a low-level voltage.

The first transistor T1 may be turned on by the first clock signal CLK1, and the first node Q and the second node QF may each maintain a low-level state. Each of the fourth node SR_QB and the fifth node SR_QBF may be in a high-level state by the first clock signal CLK1, and the sixth node QBE may be in a low-level state by the second clock signal CLK2. The third node QB may be maintained in a high-level state by the ninth transistor T9, and the first output terminal OUT1 and the second output terminal OUT2 may continuously output the output signal Out[k] of a low-level voltage and the carry signal Carry[k] of a low-level voltage, respectively.

In the sixth section P6, the previous carry signal Carry [k−1] may transit to a high-level voltage, the first clock signal CLK1 may be a low-level voltage, and the second clock signal CLK2 may be a high-level voltage.

The first transistor T1 may be turned off by the first clock signal CLK1, and the first node Q and the second node QF may each maintain a low-level state. Each of the fourth node SR_QB and the fifth node SR_QBF may be in a high-level state by the first clock signal CLK1, and the sixth node QBE may be in a high-level state by the second clock signal CLK2. At this time, the fifth node SR_QBF may have a greater high-level voltage than the high-level voltage in the fifth section P5 by the first capacitor C1. The third node QB may be in a high-level state by the ninth transistor T9. Thus, the first output node N1 may be in a low-level state by the turned-on fourteenth transistor T14, the second output node N2 may be in a low-level state by the turned-on twelfth transistor T12, and thus the first output terminal OUT1 and the second output terminal OUT2 may continuously output the output signal Out[k] of a low-level voltage and the carry signal Carry[k] of a low-level voltage, respectively.

When the third node QB is in a high-level state in the fourth through sixth sections P4 through P6, the second transistor T2 may be turned on to maintain the first node Q in the low-level state of the third voltage VGL2.

In the seventh section P7, the previous carry signal Carry[k−1] may be a high-level voltage, the first clock signal CLK1 may be a high-level voltage, and the second clock signal CLK2 may be a low-level voltage.

The first transistor T1 may be turned on by the first clock signal CLK1, and the previous carry signal Carry[k−1] may be transmitted to the first node Q so that the first node Q and the second node QF are each in a high-level state. Thus, each of the fourth node SR_QB and the fifth node SR_QBF may be in a high-level state, and the sixth node QBE may be in a low-level state by the second clock signal CLK2. The third node QB may be in a low-level state by the tenth transistor T10. The thirteenth transistor T13 and the eleventh transistor T11 may be turned on, and the first output terminal OUT1 and the second output terminal OUT2 may output the output signal Out[k] of a high-level voltage and the carry signal Carry[k] of a high-level voltage, respectively.

An operation of the stage STk in the eighth section P8 may be substantially the same as that of the stage STk in the second section P2, and an operation of the stage STk in the ninth section P9 may be substantially the same as that of the stage STk in the seventh section P7. Thus, repeated descriptions thereof will be omitted.

Figure 7:
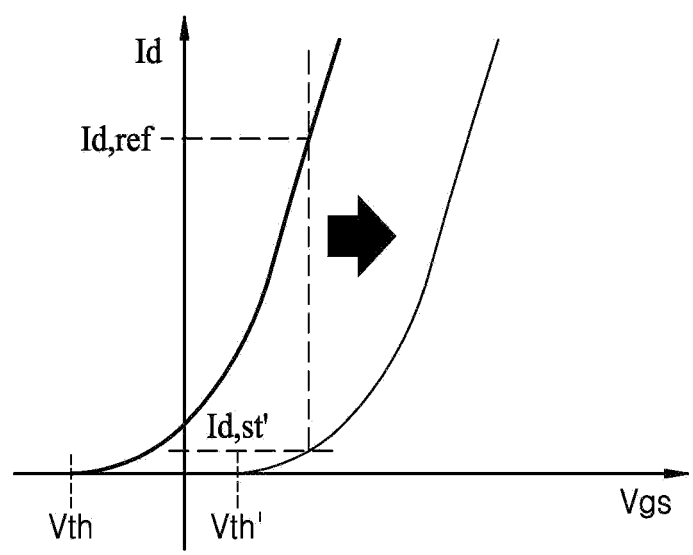
FIG. 7 is a graph for explaining a variation in the characteristics of a transistor according to some embodiments.

FIG. 7 is a graph for explaining a variation in the characteristics of a transistor.

Referring to FIG. 7, an initial threshold voltage Vth of an oxide semiconductor transistor is changed to a threshold voltage Vth' due to long-time on bias application, and thus, under the same gate-source voltage Vgs, a value of a current output by the oxide semiconductor transistor drops from Id,ref to Id,st' and an on resistance of the oxide semiconductor transistor increases. Thus, due to the resistance increase according to long-time use of the oxide semiconductor transistor, a driving circuit may not generate an output signal.

Figure 8:
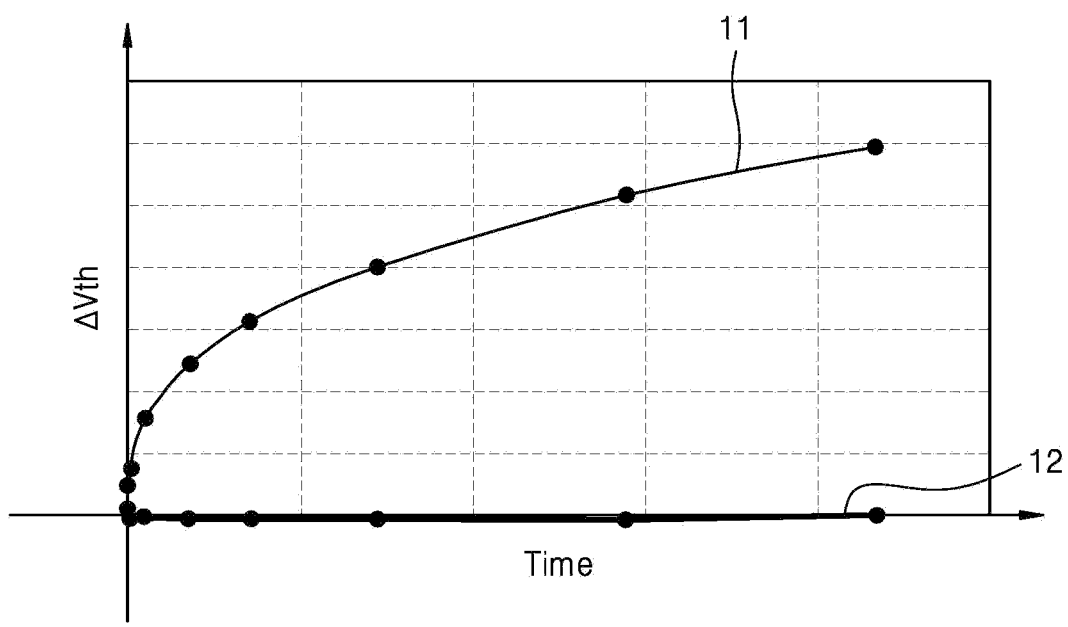
FIG. 8 is a graph for explaining a variation in the characteristics of a transistor, according to some embodiments.

FIG. 8 is a graph for explaining a variation in the characteristics of a transistor, according to some embodiments.

Referring to FIG. 8, when a high-level voltage is applied to both a top gate and a bottom gate of an N-type oxide semiconductor transistor, as in plot 11, the threshold voltage of a transistor changes over time. In FIG. 8, AVth represents the change of the threshold voltage. On the other hand, when a high-level voltage is applied to the top gate of the transistor and a low-level voltage is applied to the bottom gate of the transistor, as in plot 12, the threshold voltage of a transistor does not change over time.

A driving circuit according to some embodiments may be comprised of N-type oxide semiconductor transistors, and each transistor may have a dual gate structure with improved electrical properties, compared with a transistor having a single gate structure. In the driving circuit according to some embodiments, some transistors may receive voltages of the same polarity through their first gates and second gates, and some transistors may receive voltages of different polarities through their first gates and second gates. For example, the gate driver 130 of FIG. 3 includes a plurality of N-type transistors, and applies a low-level voltage to bottom gates of transistors having top gates to which a high-level voltage is applied for a long time (for example, at least one of the fourth transistor T4, the fifth transistor T5, the seventh transistor T7, the eighth transistor T8, or the tenth transistor T10) among the transistors of a node controller, thereby minimizing a variation in the threshold voltage of a transistor due to repeated driving in which a high-level voltage is applied to a top gate. The other transistors among the plurality of transistors may receive voltages of the same polarity (for example, a high-level voltage or a low-level voltage) applied to their top gates and bottom gates. Thus, long-time reliability of the driving circuit in which a time of outputting a high-level voltage is longer than a time of outputting a low-level voltage may be reinforced.

FIGS. 9 through 12 are diagrams illustrating various modifications of the circuit of a stage of a gate driver according to some embodiments.

Figure 9:
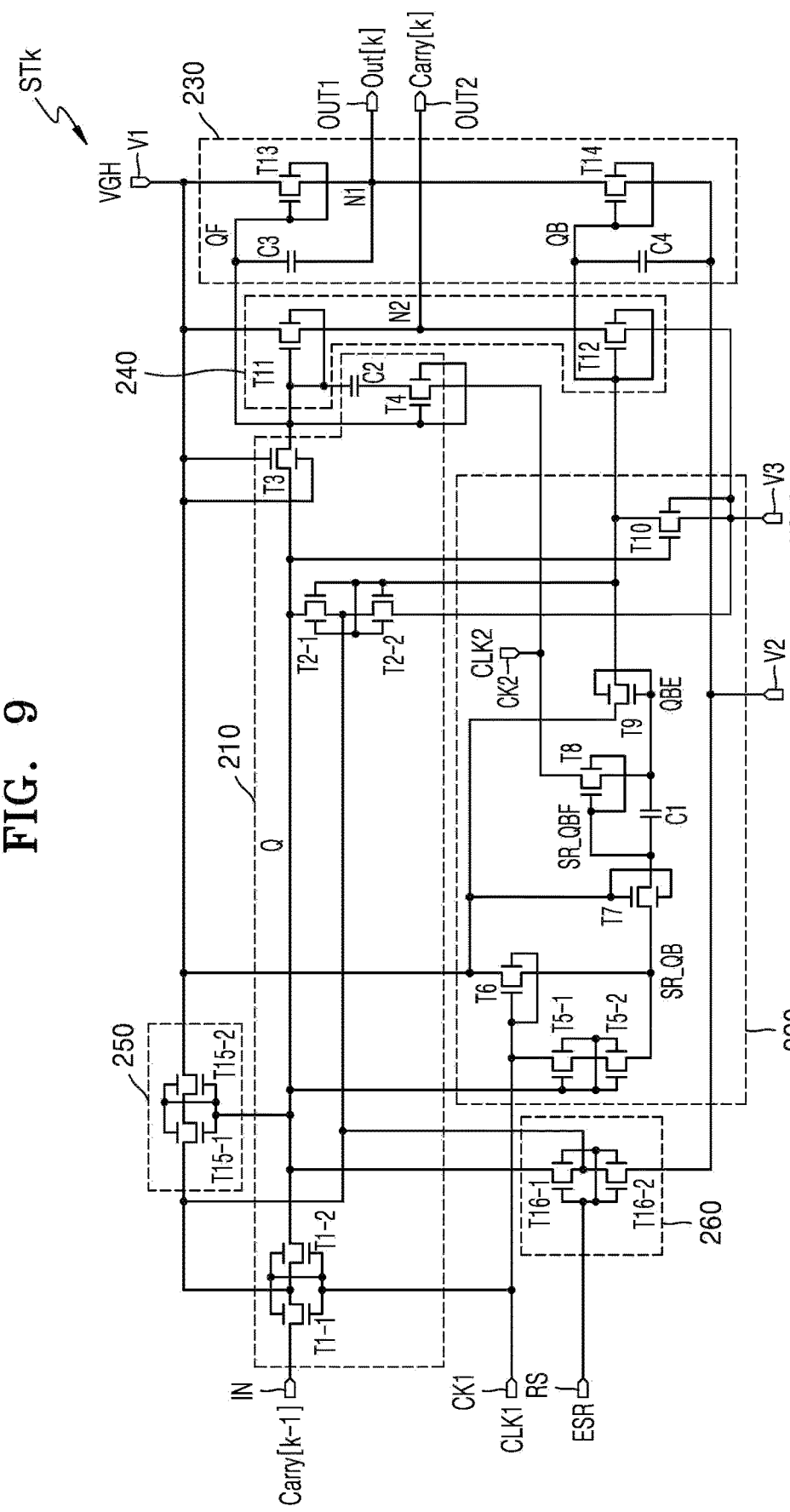
FIGS. 9 through 12 are diagrams illustrating various modifications of the circuit of a stage of a gate driver according to some embodiments.

The stage of FIG. 9 is different from the stage STk of FIG. 5. In FIG. 5, each of the fourth transistor T4, the fifth transistor T5, the seventh transistor T7, the eighth transistor T8, and the tenth transistor T10 has a gate-source sync structure. In FIG. 9, only the tenth transistor T10 has a gate-source sync structure in which a second gate of the tenth transistor T10 is connected to the third voltage input terminal V3. In the stage of FIG. 9, the first gate and the second gate of the fourth transistor T4 may be connected to the second node QF, the first gate and the second gate of the fifth transistor T5 (i.e., the first gates and the second gates of the 5-$1^{st}$ transistor T5-1 and the 5-$2^{nd}$ transistor T5-2) may be connected to the first node Q, the first gate and the second gate of the seventh transistor T7 may be connected to the first voltage input terminal V1, and the first gate and the second gate of the eighth transistor T8 may be connected to the fifth node SR_QBF. The other configurations and operations of the stage shown in FIG. 9 are the same as those of the stage STk shown in FIG. 5.

Figure 10:
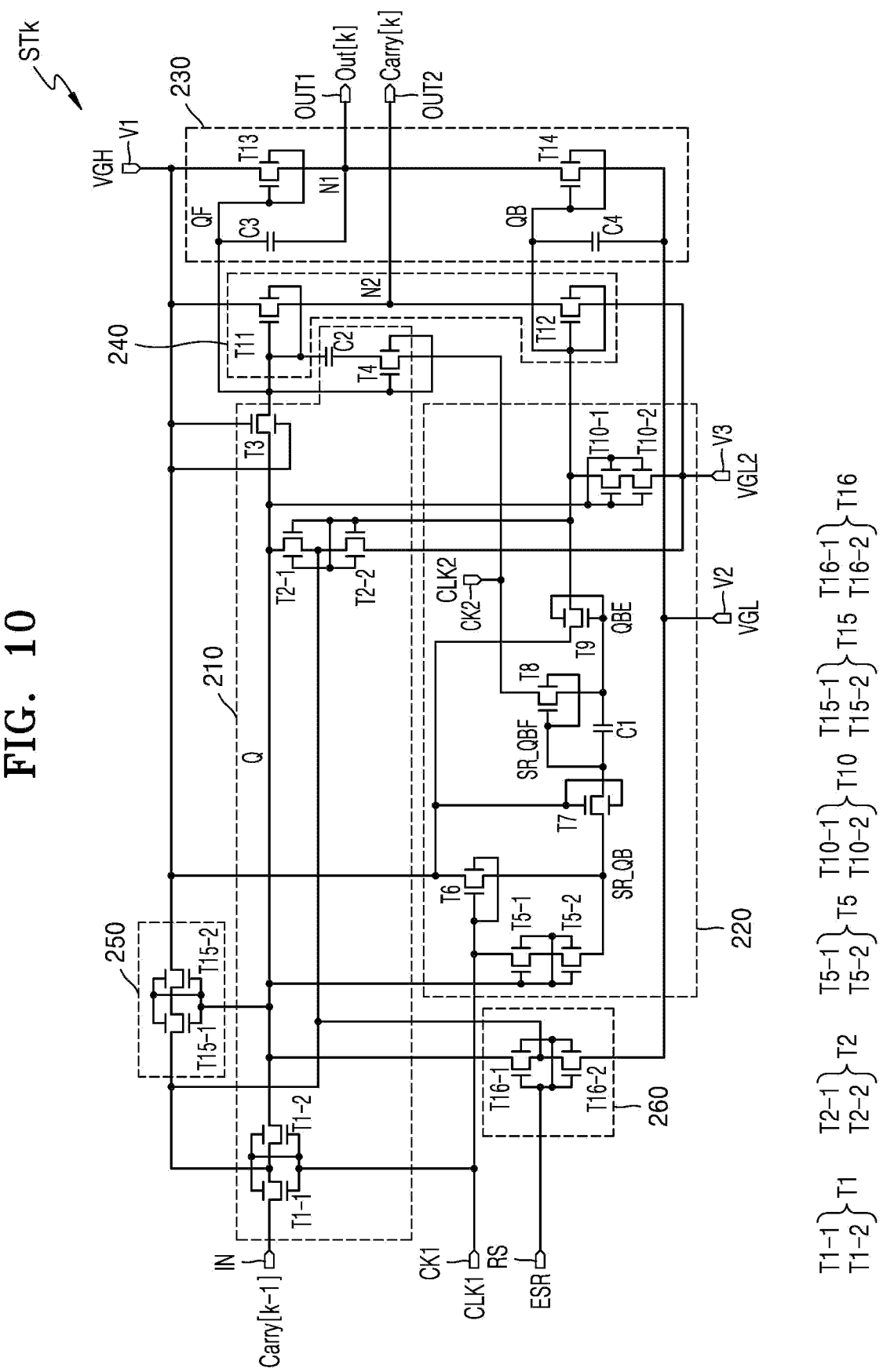

The stage of FIG. 10 is different from the stage of FIG. 9 in that the tenth transistor T10 includes a pair of sub-transistors and respective gates of the sub-transistors are connected to the first node Q. For example, the tenth transistor T10 may include a 10-$1^{st}$ transistor T10-1 and a 10-$2^{nd}$ transistor T10-2, and respective first gates and respective second gates of the 10-$1^{st}$ transistor T10-1 and the 10-$2^{nd}$ transistor T10-2 may be connected to the first node Q. The other configurations and operations of the stage shown in FIG. 10 are the same as those of the stage shown in FIG. 9. In contrast with embodiments of FIG. 9 in which voltages of different polarities are applied to the first gate and the second gate of the tenth transistor T10, the tenth transistor T10 of FIG. 10 may minimize a variation in a threshold voltage by making respective channel lengths of the 10-$1^{st}$ transistor T10-1 and the 10-$2^{nd}$ transistor T10-2 be shorter than a channel length of the single tenth transistor T10 of FIG. 9.

Figure 11:
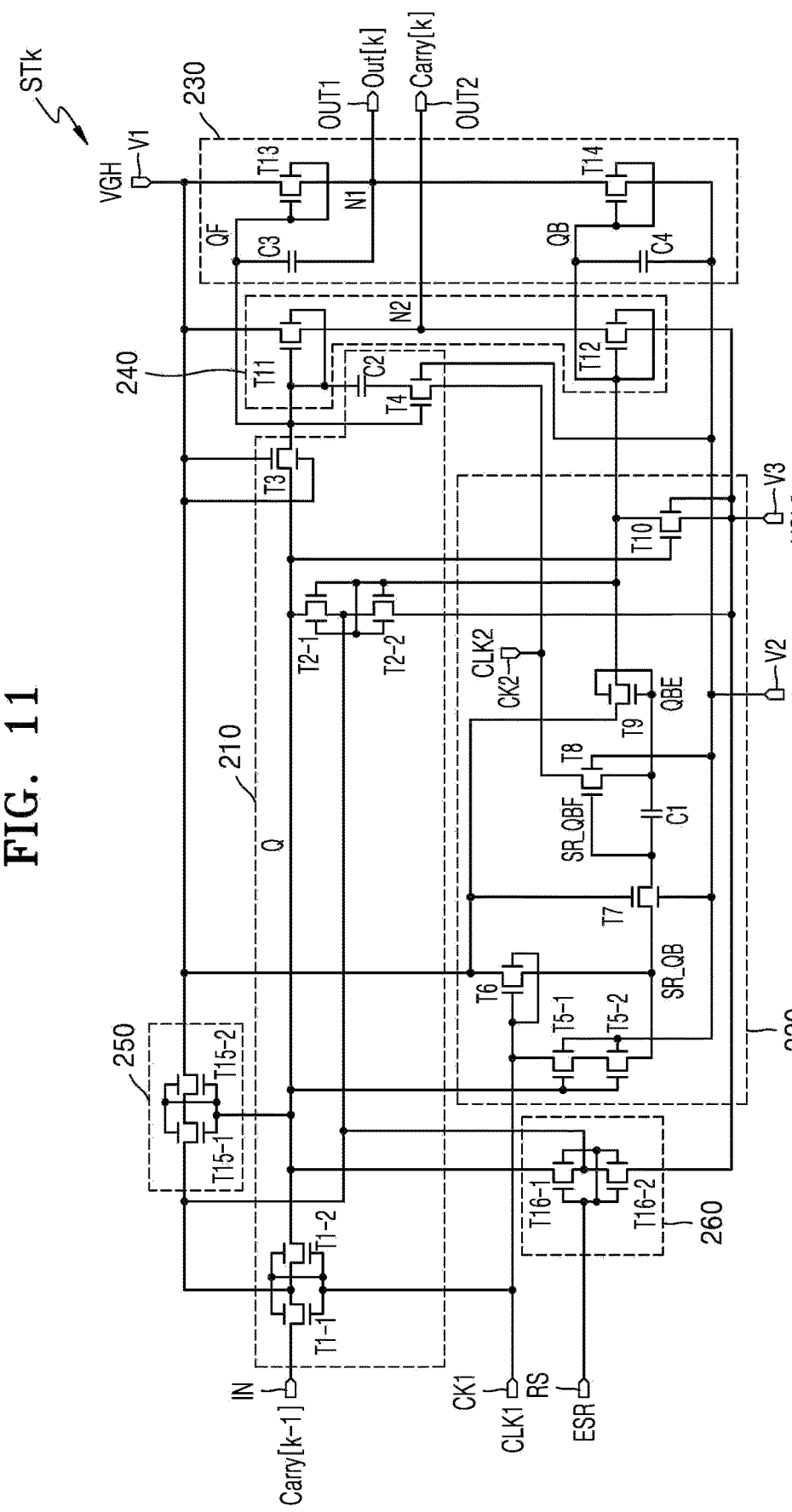

The stage of FIG. 11 is different from the stage STk of FIG. 5 in that the sixteenth transistor T16 is connected to the third voltage input terminal V3. The other configurations and operations of the stage shown in FIG. 11 are the same as those of the stage STk shown in FIG. 5. The sixteenth transistor T16 may include a 16-$1^{st}$ transistor T16-1 and a 16-$2^{nd}$ transistor T16-2 connected in series between the first node Q and the third voltage input terminal V3. First gates and second gates of the 16-$1^{st}$ transistor T16-1 and the 16-$2^{nd}$ transistor T16-2 may be connected to the reset terminal RS. The sixteenth transistor T16 may be turned on when the reset signal ESR is applied as a high-level pulse to the reset terminal RS, to reset (initialize) the voltage of the first node Q to the third voltage VGL2.

Figure 12:
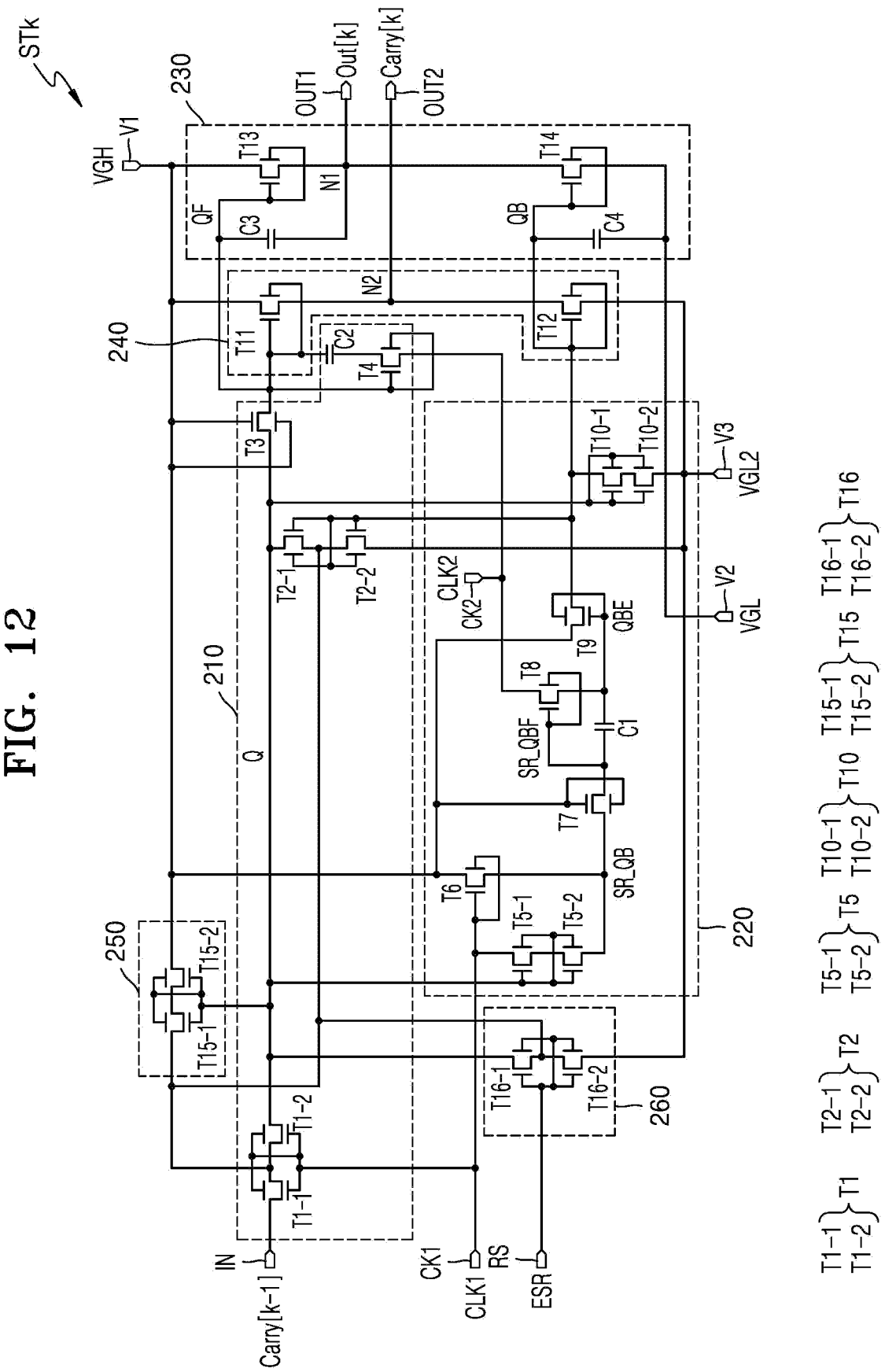

The stage of FIG. 12 is different from the stage STk of FIG. 10 in that the sixteenth transistor T16 is connected to the third voltage input terminal V3. The other configurations and operations of the stage shown in FIG. 12 are the same as those of the stage shown in FIG. 10. The sixteenth transistor T16 may include a 16-$1^{st}$ transistor T16-1 and a 16-$2^{nd}$ transistor T16-2 connected in series between the first node Q and the third voltage input terminal V3. First gates and second gates of the 16-$1^{st}$ transistor T16-1 and the 16-$2^{nd}$ transistor T16-2 may be connected to the reset terminal RS. The sixteenth transistor T16 may be turned on when the reset signal ESR is applied as a high-level pulse to the reset terminal RS, to reset (initialize) the voltage of the first node Q to the third voltage VGL2.

Gate drivers according to embodiments may include N-type transistors, may compensate for deterioration of the characteristics of the transistors due to bias stress or an increase in leakage current according to temperature, and may generate a gate signal having a high-level ON voltage.

A display apparatus according to some embodiments may be, for example, an organic light-emitting display apparatus, an inorganic light-emitting display apparatus, or a quantum dot light-emitting display apparatus.

According to embodiments, a gate driver capable of stably outputting a gate signal, and a display apparatus including the gate driver are provided. Effects of the disclosure are not limited to the above effects but may variously extend without departing from the scope of the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A gate driver comprising a plurality of stages, wherein each of the plurality of stages comprises:
a first node controller configured to control respective voltage levels of a first node and a second node;
a second node controller configured to control a voltage level of a third node; and
a first output unit comprising a first pull-up transistor connected to a first voltage input terminal configured to receive a first voltage of a first voltage level and being configured to output a gate signal of the first voltage in response to the second node being in the first voltage level, and a first pull-down transistor connected to a second voltage input terminal configured to receive a second voltage of a second voltage level and being configured to output a gate signal of the second voltage in response to the third node being in the first voltage level,
the first node controller comprises a first control transistor connected between the first node and the second node, and the first control transistor comprises a gate that is connected to the first voltage input terminal,
the second node controller comprises a second control transistor connected between the third node and a third voltage input terminal configured to receive a third voltage of a third voltage level, and the second control transistor comprises a gate connected to the first node, and
a voltage level of the third voltage is lower than a voltage level of the second voltage,
wherein each of the plurality of stages further comprises a second output unit comprising:
a second pull-up transistor configured to output a carry signal of the first voltage in response to the second node being in the first voltage level; and
a second pull-down transistor configured to output a carry signal of the third voltage in response to the third node being in the first voltage level.

2. The gate driver of claim 1, wherein the first node controller further comprises:
a first transistor connected between an input terminal configured to receive a start signal and the first node, and having a gate connected to a first clock terminal configured to receive a first clock signal; and
a second transistor connected between the first node and the third voltage input terminal and having a gate connected to the third node.

3. The gate driver of claim 2, wherein
the first transistor comprises a 1-1$^{st}$ transistor and a 1-2$^{nd}$ transistor serially connected to each other, and
the second transistor comprises a 2-1$^{st}$ transistor and a 2-2$^{nd}$ transistor serially connected to each other.

4. The gate driver of claim 3, wherein each of the plurality of stages further comprises a leakage blocking transistor having a gate connected to the first node, one end connected to the first voltage input terminal, and the other end connected to an intermediate node between the 1-1$^{st}$ transistor and the 1-2$^{nd}$ transistor and an intermediate node between the 2-1$^{st}$ transistor and the 2-2$^{nd}$ transistor.

5. The gate driver of claim 2, further comprising:
a fourth transistor having a first terminal connected to a second clock terminal configured to receive a second clock signal and a gate connected to the second node; and
a first capacitor connected between the second node and a second terminal of the fourth transistor.

6. The gate driver of claim 5, wherein the controller comprises:
a fifth transistor connected between the first clock terminal configured to receive the first clock signal and a fourth node and comprising a gate connected to the first node;
a sixth transistor connected between the first voltage input terminal and the fourth node and comprising a gate connected to the first clock terminal;
a seventh transistor connected between the fourth node and a fifth node and comprising a gate connected to the first voltage input terminal;
a second capacitor connected between the fifth node and a sixth node;
an eighth transistor connected between a second clock terminal configured to receive a second clock signal and the sixth node and comprising a gate connected to the fifth node; and
a ninth transistor connected between the first voltage input terminal and the third node and comprising a gate connected to the sixth node, and
the second clock signal has a phase shifted by a predetermined time from the first clock signal.

7. The gate driver of claim 6, wherein a length of a duration in which the start signal is in the third voltage level is greater than a period of each of the first clock signal and the second clock signal.

8. The gate driver of claim 2, wherein
the second control transistor is configured to control the third node to the second voltage level in response to the first node being in the first voltage level, and
the second node controller further comprises a controller configured to control the third node to a first voltage level in response to the first node being in the second voltage level.

9. The gate driver of claim 2, wherein a timing at which the second voltage of the gate signal starts is delayed relative to a timing at which the second voltage level of the start signal starts by a predetermined time.

10. The gate driver of claim 1, wherein
each of the plurality of stages further comprises a transistor connected between the first node and the second voltage input terminal, the transistor being configured to reset the first node,
the transistor comprises a pair of sub-transistors serially connected to each other, in which a gate of each of the sub-transistors is connected to a reset terminal configured to receive a reset signal.

11. The gate driver of claim 1, wherein a gate of the first pull-up transistor is connected to the second node and a gate of the first pull-down transistor is connected to the third node.

12. A gate driver comprising a plurality of stages, wherein each of the plurality of stages comprises:
a first transistor connected between an input terminal configured to receive a start signal and a first node, and having a gate connected to a first clock terminal configured to receive a first clock signal;
a first control transistor connected between the first node and a second node, and having a gate connected to a first voltage input terminal configured to receive a first voltage of a first voltage level;
a second transistor connected between the first node and a second voltage input terminal configured to receive a second voltage of a second voltage level, and having a gate connected to a third node;

a second control transistor connected between the third node and the second voltage input terminal, and having a gate connected to the first node;

a first pull-up transistor connected to the first voltage input terminal, having a gate connected to the second node, and being configured to output a gate signal of the first voltage in response to the second node being in the first voltage level; and a first pull-down transistor connected to a third voltage input terminal configured to receive a third voltage of a third voltage level, having a gate connected to the third node, and being configured to output a gate signal of the third voltage in response to the third node being in the first voltage level, wherein the second voltage input terminal is configured to receive a second voltage of an off-voltage level, the second control transistor comprises a pair of sub-transistors serially connected to each other, and a first gate and a second gate of each of the sub-transistors are connected to the first node, and a voltage level of the second voltage is lower than a voltage level of the third voltage.

13. The gate driver of claim 12, wherein each of the plurality of stages further comprises:

a second pull-up transistor connected to the first voltage input terminal, having a gate connected to the second node, and being configured to output a carry signal of the first voltage in response to the second node being in the first voltage level; and a second pull-down transistor connected to the second voltage input terminal, having a gate connected to the third node, and being configured to output a carry signal of the second voltage in response to the third node being in the first voltage level.

14. The gate driver of claim 12, wherein the first transistor comprises a $1\text{-}1^{st}$ transistor and a $1\text{-}2^{nd}$ transistor serially connected to each other, and the second transistor comprises a $2\text{-}1^{st}$ transistor and a $2\text{-}2^{nd}$ transistor serially connected to each other.

15. The gate driver of claim 14, wherein each of the plurality of stages further comprises a leakage blocking transistor having a gate connected to the first node, having one end connected to the first voltage input terminal, and having the other end connected to an intermediate node between the $1\text{-}1^{st}$ transistor and the $1\text{-}2^{nd}$ transistor and an intermediate node between the $2\text{-}1^{st}$ transistor and the $2\text{-}2^{nd}$ transistor.

16. The gate driver of claim 12, wherein each of the plurality of stages further comprises:

a fourth transistor having a first terminal connected to a second clock terminal configured to receive a second clock signal and having a gate connected to the second node; and a first capacitor connected between the second node and a second terminal of the fourth transistor, and the second control transistor is configured to control the third node to an off-voltage level state in response to the first node being in an on-voltage level state.

17. The gate driver of claim 12, wherein each of the plurality of stages further comprises:

a fifth transistor connected between the first clock terminal configured to receive the first clock signal and a fourth node and comprising a gate connected to the first node;

a sixth transistor connected between the first voltage input terminal and the fourth node and comprising a gate connected to the first clock terminal;

a seventh transistor connected between the fourth node and a fifth node and comprising a gate connected to the first voltage input terminal;

a second capacitor connected between the fifth node and a sixth node;

an eighth transistor connected between a second clock terminal configured to receive a second clock signal and the sixth node and comprising a gate connected to the fifth node; and a ninth transistor connected between the first voltage input terminal and the third node and comprising a gate connected to the sixth node, and the second clock signal has a phase shifted by a predetermined time from the first clock signal.

18. The gate driver of claim 17, wherein a length of a duration in which the start signal is in the second voltage level is greater than a period of each of the first clock signal and the second clock signal.

19. The gate driver of claim 12, wherein a timing at which the third voltage of the gate signal starts is delayed relative to a timing at which the second voltage level of the start signal starts by a predetermined time.

20. The gate driver of claim 12, wherein each of the plurality of stages further comprises a transistor connected between the first node and the second voltage input terminal, the transistor being configured to reset the first node, and the transistor comprises a pair of sub-transistors serially connected to each other, wherein a gate of each of the sub-transistors is connected to a reset terminal configured to receive a reset signal.

* * * * *